United States Patent [19]

Matsubara

[11] Patent Number: 5,566,109
[45] Date of Patent: Oct. 15, 1996

[54] EEPROM, WRITE CONTROL METHOD FOR EEPROM, AND IC CARD

[75] Inventor: Toshiyuki Matsubara, Itami, Japan

[73] Assignees: Mitsubishi Denki Kabushiki Kaisha; Mitsubishi Electric Semiconductor Software Co., Ltd., both of Tokyo, Japan

[21] Appl. No.: 362,973

[22] Filed: Dec. 23, 1994

[30] Foreign Application Priority Data

Dec. 28, 1993 [JP] Japan .................................... 5-335374

[51] Int. Cl.⁶ .................................................. G11C 11/34
[52] U.S. Cl. ............................. 365/185.12; 365/185.11; 365/238.5
[58] Field of Search ........................ 365/185.12, 185.11, 365/238.5, 185.23

[56] References Cited

U.S. PATENT DOCUMENTS

| | | | |
|---|---|---|---|
| 5,105,386 | 4/1992 | Andoh et al. | 365/185.12 |
| 5,323,351 | 6/1994 | Challa | 365/185.12 |
| 5,367,655 | 11/1994 | Grossman et al. | 365/238.5 |

Primary Examiner—David C. Nelms
Assistant Examiner—Huan Hoang
Attorney, Agent, or Firm—Leydig, Voit & Mayer

[57] ABSTRACT

In an EEPROM, a column decoder control register stores, in accordance with a first signal on a system bus, a state indicating whether one byte of bit lines or all of the bit lines are selected. When the column decoder control register stores the state for selecting all of the bit lines, a column decoder selects a full Y-gate so that the same data is latched in a full column latch by latching data once. The latched data is written by a controller into all bytes in a page.

11 Claims, 19 Drawing Sheets

EEPROM, WRITE CONTROL METHOD FOR EEPROM, AND IC CARD

BACKGROUND OF THE INVENTION

1. Field of the Invention

The present invention relates to an EEPROM as a nonvolatile memory. The present invention also relates to a write control method for the EEPROM and an IC card with the EEPROM mounted therein.

2. Description of the Related Art

FIG. 18 is a functional block diagram of a conventional IC card. Referring to FIG. 18, an IC card 1 includes a CPU 2 for processing data, to which a masked ROM 3, a RAM 4, an EEPROM 5 and an input/output circuit 6 are connected through a system bus 24. The masked ROM 3 stores processing programs for executing various functions of the IC card 1, the RAM 4 stores data temporarily required, and the EEPROM 5 stores various information required to be always stored, results of processing data, etc. The input/output circuit 6 controls transfer of data between the IC card 1 and the exterior. Specifically, the input/output circuit 6 performs parallel/serial conversion of parallel data present on the system bus 24 in accordance with an instruction from the CPU 2 and outputs the resultant serial data through an I/O terminal P5. The input/output circuit 6 also performs serial/parallel conversion of serial data input through the I/O terminal P5. Further, denoted by P1 is a $V_{DD}$ terminal, P2 is a GND terminal, P3 is a reset input terminal (RST terminal) for initializing the IC card 1, and P4 is a clock terminal (CLK terminal) through which an external clock signal $X_{IN}$ is input.

The operation of the EEPROM will be described below with reference to a structural block diagram of the EEPROM shown in FIG. 19. A memory cell array 8 has a number of word lines 8a extending from a row decoder 9 to a $V_{PP}$ switch 16, a number of bit lines 8b extending from a Y-gate 10 to a $V_{PP}$ switch 17, and memory cells 8c connected to the word lines 8a and the bit lines 8b at respective intersections of the two lines. A controller 20 is a sequence circuit having foul states, i.e., READY, LATCH, ERASE and WRITE, with an internal clock signal CLK applied as the clock. READY represents a state where the controller 20 is not brought into a write state. LATCH, ERASE and WRITE represent states where the controller 20 outputs respectively a latch signal, an erase signal and a write signal. The controller 20 enters the LATCH state upon detecting latching of data to be written into the EEPROM 5 from the exterior, stores the data on the system bus 24 in a column latch 18 sequentially, and then enters the ERASE state upon detecting a write command signal, followed by entering the WRITE state to complete writing of the data.

A timer 21 measures, based on the internal clock signal CLK, the time elapsed from latching of one data word to latching of next data word, and the time elapsed from latching of the data to input of the write command signal. If the measured time exceeds a predetermined time-out period, indicating an abnormal condition of the controller 20, the operation executed so far is invalidated, i.e., the data in the column latch 18 is canceled. When generating the erase signal and the write signal, the controller 20 also outputs a $V_{PP}$ generating signal to a $V_{PP}$ generator 19. Upon receiving the $V_{PP}$ generating signal from the controller 20, the $V_{PP}$ generator 19 boosts a source voltage $V_{DD}$ to produce a high voltage $V_{PP}$, e.g., a voltage of 20 V, using an oscillation signal from an oscillator 22 and then supplies the high voltage $V_{PP}$ to both the $V_{PP}$ switches 16 and 17.

Further, in accordance with an address held by an address latch 23, the row decoder 9 selects one word line 8a and the column decoder 11 selects one byte of the Y-gate 10. The data on the system bus 24 is input through a data latch 15 and a write buffer 14 to the selected byte of the Y-gate 10 and is then stored in the column latch 18. On the other hand, the data read out of the memory cell array 8 is amplified by a sense amplifier 12 through the Y-gate 10 and is output to the system bus 24 through an output buffer 13.

The $V_{PP}$ switch 16 supplies the high voltage $V_{PP}$ supplied from the $V_{PP}$ generator 19 to the word line 8a selected by the row decoder 9, and the $V_{PP}$ switch 17 supplies the high voltage $V_{PP}$ to the bit lines 8b in accordance with the information stored in the column latch 18.

Because EEPROMs generally take a long write time, a large-capacity EEPROM has a page write function with which plural bytes of data to be written in the same page are stored in the column latch 18 and the thus-stored plural bytes of data are once written into the memory cells 8c associated with the selected word line 8a. Such a page write function enables the write time to be substantially reduced.

The conventional EEPROM is constructed and operated as described above. Therefore, when writing the same data in the same page, e.g., when shipping an EEPROM after writing fixed data, e.g., "FF", in its certain area, it is required to repeat the operation of storing the same data "FF" in the column latch 18 as many times as the number of bytes making up one page, i.e., the number of bytes connected to one word line, and to execute writing of the data into the memory cells 8c after the data of one page has been completely stored in the column latch 18. This means that the data write time has been prolonged.

Also, when writing different data, e.g., "00" and "FF" alternately, in every bytes over all the pages as needed when checking interference between the memory cells 8c in units of one byte, it is required to store the data of one page in the column latch 18, write the data of one page, and thereafter repeat the above operation to cover all the pages. This has also resulted in a prolonged data write time. Further, in the case of desiring to write the same data in all the memory cells 8c as needed when writing the data ten thousand times, for example, to check the write operation in the memory cells 8c or to check reliability i.e. the number of times of successful writing into the memory cells 8c, it is required to repeatedly latch the same data as many times as the number of bytes in one page, write the data of one page, and thereafter repeat the above operation to cover all the pages. This has similarly resulted in a prolonged data write time.

Meanwhile, because the high voltage $V_{PP}$ is applied to the word line 8a in the EEPROM upon data being written, a problem has been raised in that gate oxide films may be broken, for example, due to stresses caused by the high voltage $V_{PP}$ and the word line 8a may fail to disable writing of the data into the memory cells 8c. Additionally, since a guaranteed number of times of writing is generally determined for EEPROMs, the allowable number of times that the high voltage is applied to the word line 8a can be foreseen, but generally the guaranteed number of times of reading is not determined. This may cause trouble from stresses caused by the source voltage $V_{DD}$ when the voltage $V_{DD}$ is applied to the word line 8a for a long period of time as a result of repeating reading a number of times. Thus, there have been problems giving rise to trouble due to stresses caused by the high voltage $V_{PP}$ and trouble due to stresses caused by the source voltage $V_{DD}$. Such troubles may also occur on the bit lines 8b besides the word lines 8a. Whether the troubles are more apt to occur on the word lines 8a or the bit lines 8b depends on the manufacturing process and the cell design, i.e., varies depending on individual products. In some cases, the word lines 8a and the bit lines 8b may both be subject to the troubles. Accordingly, reliability of EEPROMs for commercial use must be increased by checking for the presence of possible troubles and selecting good products during the test stage.

SUMMARY OF THE INVENTION

With a view of solving the above-mentioned problems in the art, an object of the present invention is to provide an EEPROM in which the same data can be written into a plurality of memory cells in a short period of time.

Another object of the present invention is to provide an EEPROM in which a voltage can be applied to a plurality of word lines or bit lines simultaneously for selecting the EEPROM that is susceptible to stresses caused by a high voltage $V_{PP}$ or a source voltage $V_{DD}$.

Still another object of the present invention is to provide a write control method for an EEPROM by which the same data can be written into a plurality of memory cells in a short period of time.

Still another object of the present invention is to provide a write control method for an EEPROM by which a voltage can be applied to a plurality of word lines or bit lines simultaneously.

Still another object of the present invention is to provide an IC card with an EEPROM in which the same data can be written into a plurality of memory cells in a short period of time, and a voltage can be applied to a plurality of word lines or bit lines simultaneously.

An EEPROM according to the first aspect of the present invention comprises a memory cell array having a plurality of memory cells which are connected to a plurality of bit lines and a plurality of word lines, a column decoder for bit line selection, a row decoder for word line selection, a first control register for, in accordance with a first signal externally applied, storing either state as to whether one byte of the bit lines or all of the bit lines are selected, and informing the column decoder of which state is stored, a column latch for latching data, and a controller for instructing the column latch to latch data externally applied, and writing the latched data into the memory cells which are connected to one byte or all of the bit lines and the word line selected respectively by the column decoder and the row decoder.

An EEPROM according to the second aspect of the present invention comprises a memory cell array having a plurality of memory cells which are connected to a plurality of bit lines and a plurality of word lines, a column decoder for bit line selection, a row decoder for word line selection, a second control register for, in accordance with a second signal externally applied, storing either state as to whether one of the word lines or all the word lines are selected, and informing the row decoder of which state is stored, a column latch for latching data, and a controller for instructing the column latch to latch data externally applied, and writing the latched data into the memory cells which are connected to the bit lines and one or all of the word lines selected respectively by the column decoder and the row decoder.

An EEPROM according to the third aspect of the present invention comprises a memory cell array having a plurality of memory cells which are connected to a plurality of bit lines and a plurality of word lines, a column decoder bit line selection, a row decoder for word line selection, a column latch for latching data, a $V_{PP}$ generator for generating a high voltage $V_{PP}$, a third control register rot, in accordance with a third signal externally applied, storing either state as to whether a load is applied to or data is written into the memory cells of the memory cell array, and a controller for causing the high voltage $V_{PP}$ generated by the $V_{PP}$ generator to be applied to all the bit lines when the third control register stores the state of a load, and for instructing the column latch to latch data externally applied and writing the latched data into the memory cells which are connected to the bit lines and the word line selected by the column decoder and the row decoder, respectively, when the third control register stores the state of writing data.

An EEPROM according to the fourth aspect of the present invention comprises a memory cell array having a plurality of memory cells which are connected to a plurality of bit lines and a plurality of word lines, a column decoder for bit line selection, a row decoder for word line selection, a column latch for latching data, a $V_{PP}$ generator for generating a high voltage $V_{PP}$, a fourth control register for, in accordance with a fourth signal externally applied, storing either state as to whether the high voltage $V_{PP}$ or a source voltage $V_{DD}$ is applied, a sixth control register for, in accordance with a sixth signal externally applied, storing either state as to whether or not all the bit lines and all the word lines are selected, and a controller for causing one of the high voltage $V_{PP}$ generated by the $V_{PP}$ generator and the source voltage $V_{DD}$ to be applied to all the bit lines and all the word lines in accordance with the state stored in the fourth control register when the sixth control register stores the stale of selecting all the bit lines and all the word lines, and for instructing the column latch to latch data externally applied and writing the latched data into the memory cells which are connected to the bit lines and the word line selected by the column decoder and the row decoder, respectively, when the third control register does not store the state of selecting all the bit lines and all the word lines.

A write control method for an EEPROM according to the fifth aspect of the present invention comprises the steps of selecting all bit lines, latching data of one byte, and writing the same data into all bytes in the same page by writing the latched data of one byte.

A write control method for an EEPROM according to the sixth aspect of the present invention comprises the steps of selecting all word lines, latching data to be written, and writing the same data into all pages by writing the latched data.

A write control method for an EEPROM according to the seventh aspect of the present invention comprises the steps of generating a high voltage $V_{PP}$ for writing, selecting some of the bit lines and of the word lines, and applying the high voltage $V_{PP}$ simultaneously to all the bit lines or all the word lines selected.

A write control method for an EEPROM according to the eighth aspect of the present invention comprises the steps of generating a high voltage $V_{PP}$ for writing, selecting one of the high voltage $V_{PP}$ and a source voltage $V_{DD}$, selecting at least some of the bit lines and all word lines, and applying the selected high voltage $V_{PP}$ or source voltage $V_{DD}$ simultaneously to all the bit lines and/or all the word lines selected.

A write control method for an EEPROM according to the ninth aspect of the present invention comprises the steps of:
selecting whether a load is applied, writing the same data all over areas in a memory by selecting all bit lines, selecting all word lines, latching data of one byte, and writing the latched data of one byte, when a load is selected to be not applied, and generating a high voltage $V_{PP}$ for writing, selecting one of the high voltage $V_{PP}$ and a source voltage $V_{DD}$, selecting some of the word lines and all the bit lines, and applying the selected high voltage $V_{PP}$ or source voltage $V_{DD}$ simultaneously to all the word lines or all the bit lines selected, when a load is selected to be applied.

An IC card according to the tenth aspect of the present invention comprises a CPU for processing data, a ROM for storing processing programs, a RAM for storing data temporarily, an EEPROM having a page write function to enable plural bytes of data to be written once, and an input/output circuit for transferring data to and from the exterior, The EEPROM comprising a memory cell array having a plurality of memory cells which are connected to a plurality of bit lines and a plurality of word lines, a column decoder for bit line selection, a row decoder for word line selection, a first control register for, in accordance with a first signal externally applied, storing either state as to whether one byte of the bit lines or all the bit lines are selected, and informing the column decoder of which state is stored, a second control register for, in accordance with a second signal externally applied, storing either state as to whether one of the word lines or all the word lines are selected, and informing the row decoder of which state is stored, a column latch for latching data, a third control register for, in accordance with a third signal externally applied, storing either state as to whether a load is applied to or data is written into the memory cells of the memory cell array, a fourth control register for, in accordance with a fourth signal externally applied, storing either state as to whether the high voltage $V_{PP}$ or a source voltage $V_{DD}$ is applied, a fifth control register for, in accordance with a fifth signal externally applied, storing either state as to whether the word lines or the bit lines are selected, and a controller for causing one of the high voltage $V_{PP}$ generated by the $V_{PP}$ generator and the source voltage $V_{DD}$ to be applied in accordance with the state stored in the fourth control register to all the bit lines or all the word lines in accordance with the state stored in the fifth control register when the third control register stores the state of applying a load, and for instructing the column latch to latch data externally applied, and writing the latched data into the memory cells which are connected to the bit lines and the word line selected respectively by the column decoder and the row decoder when the third control register stores the state of writing data.

DESCRIPTION OF THE PREFERRED EMBODIMENTS

Preferred embodiments of the present invention will be hereinafter described with reference to the accompanying drawings.

EMBODIMENT 1

Figure 1:
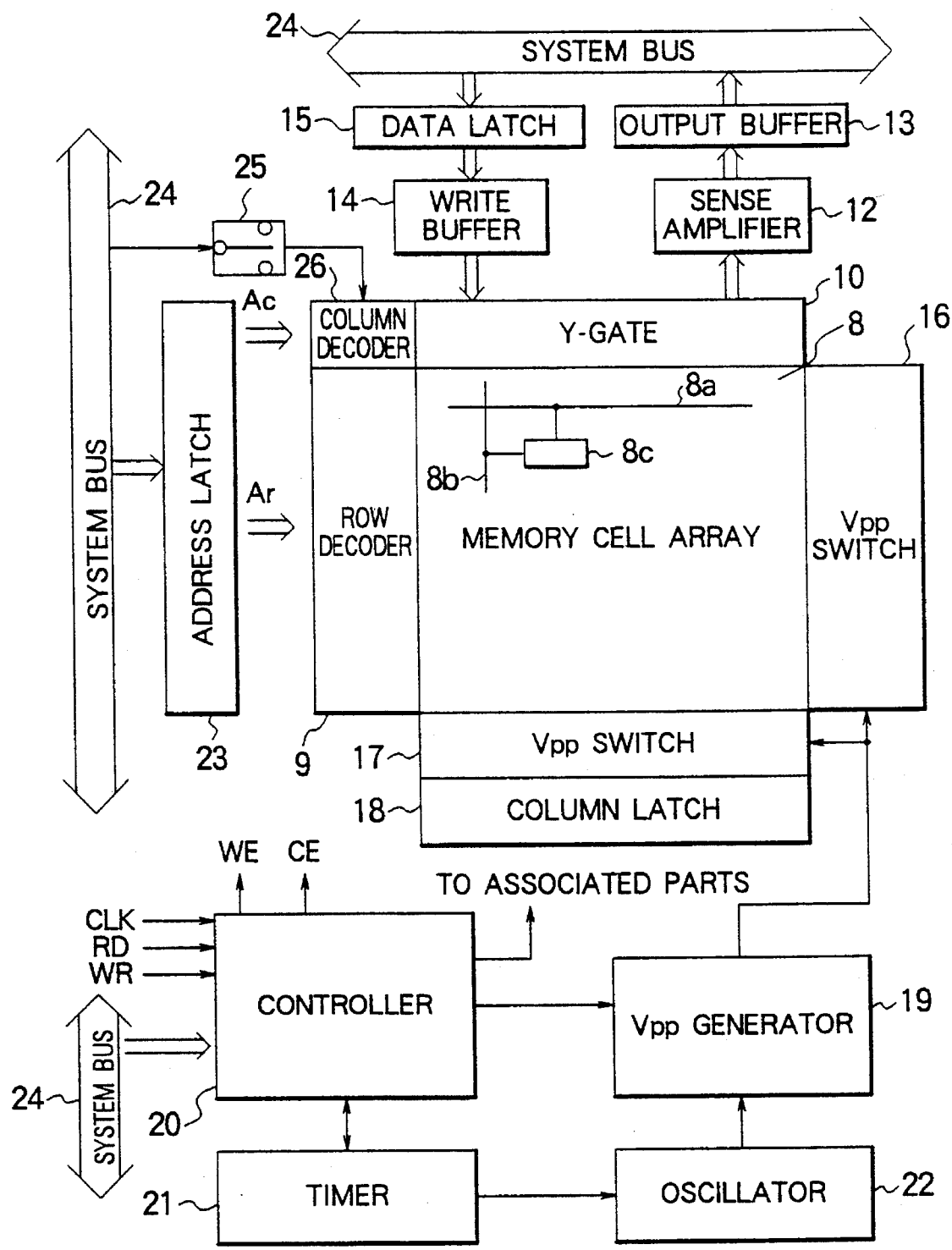
FIG. 1 is a structural block diagram showing an EEPROM according to Embodiment 1 of the present invention.

FIG. 1 shows a structural block diagram of an EEPROM according to Embodiment 1. In FIG. 1, a memory cell array 8 has a number of word lines 8a extending from a row decoder 9 to a $V_{PP}$ switch 16, a number of bit lines 8b extending from a Y-gate 10 to a $V_{PP}$ switch 17, and memory cells 8c connected to the word lines 8a and the bit lines 8b at respective intersections between the two lines. A controller 20 is a sequence circuit having four states, i.e., READY, LATCH, ERASE and WRITE, with an internal clock signal CLK applied as the clock.

A timer 21 measures, based on the internal clock signal CLK, the time elapsed from latching of one data word to latching of next data word, and the time elapsed from latching of the data to input of a write command signal. If the measured value exceeds a predetermined time-out period, this is judged as indicating an abnormal condition of the controller 20, and the data in a column latch 18 is canceled. When generating an erase signal and a write signal, the controller 20 also outputs a $V_{PP}$ generating signal to a $V_{PP}$ generator 19. Upon receiving the $V_{PP}$ generating signal from the controller 20, the $V_{PP}$ generator 19 boosts a $V_{DD}$ source voltage to produce a high voltage $V_{PP}$, e.g., a voltage of 20 V, using an oscillation signal from an oscillator 22 and then supplies the high voltage $V_{PP}$ to both $V_{PP}$ switches 16 and 17.

The data on a system bus 24 is input through a data latch 15 and a write buffer 14 to the Y-gate 10 and is then stored in the column latch 18. On the other hand, the data read out of the memory cell array 8 is amplified by a sense amplifier 12 through the Y-gate 10 and is output to the system bus 24 through an output buffer 13. Furthermore, a column decoder 26 is connected to the Y-gate 10, and the system bus 24 is connected to the column decoder 26 and the row decoder 9 through an address latch 23.

A column decoder control register 25, as a first control register, is connected to the column decoder 26. In response to a first signal on the system bus 24, the control register 25 stores either of the state where the full Y-gate 10 is selected and the state where address data is decoded and only one byte of the Y-gate is selected depending on the decoded result, and then transmits a control signal informing the column decoder 11 which state is stored. The address data on the system bus 24 is latched by the address latch 23 and is input to the column decoder 26 for decoding of the address data. At this time, in response to the control signal from the column register 25, the column decoder 26 selects one byte of the Y-gate 10 determined by the decoding or the full Y-gate 10 corresponding to all of bytes thereof.

Figure 2:
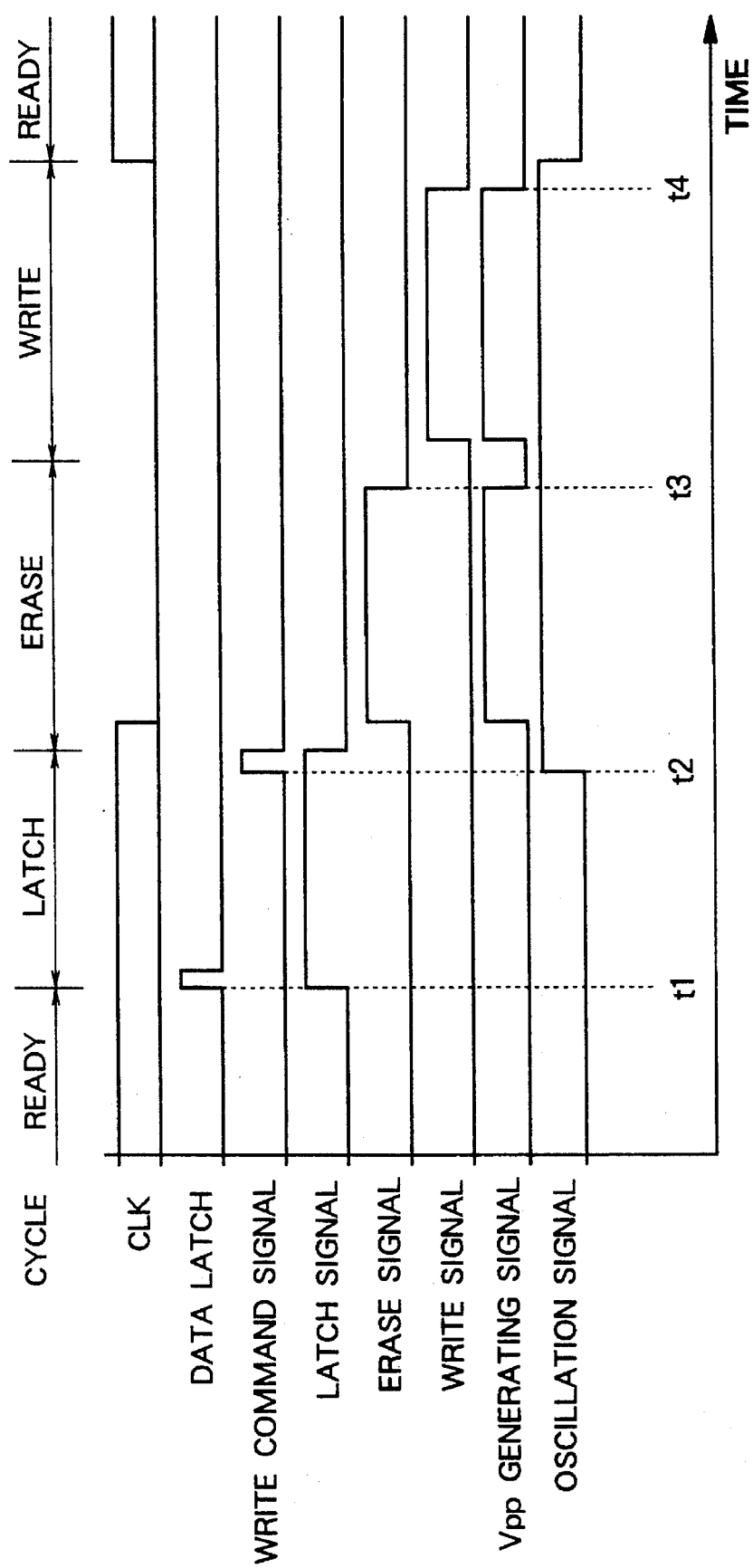
FIG. 2 is a timing chart showing the operation of the EEPROM of Embodiment 1.
Figure 3:
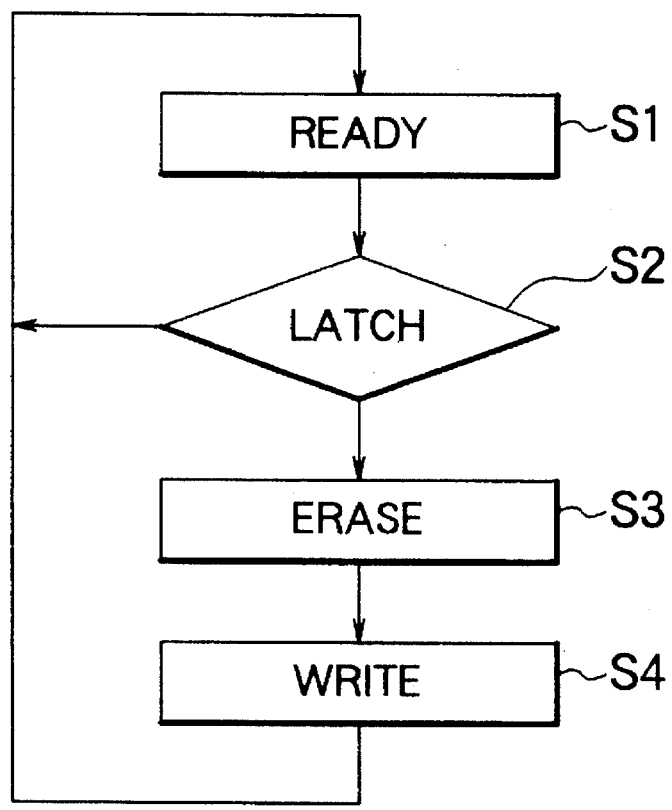
FIG. 3 is a flowchart showing the operation of the EEPROM of Embodiment 1.

The sequence of write operation to the EEPROM will be described below with reference to a timing chart of FIG. 2 and a flowchart of FIG. 3. As shown in FIG. 3, the controller 20 has the four states, i.e., READY (S1), LATCH (S2), ERASE (S3) and WRITE (S4). Data is read in the READY state. In the case of desiring to write the same data in one page, the control register 25 connected to the column decoder 26 is set to the state of selecting the full Y-gate 10 before the data is latched for writing into the EEPROM, i.e., in the READY state prior to entering LATCH state.

By effecting data latching at the time t1 under the above condition, the controller 20 shifts to the LATCH state to output a latch signal of H level. Then, the address data on the system bus 24 is latched by the address latch 23, and the row decoder 9 selects one word line in accordance with the latched address data. On the other hand, the column decoder 26 selects the full Y-gate 10 in response to the control signal from the control register 25 regardless of the address data. The data on the system bus 24 is latched by the full column latch 18 in one operation of the data latch. Simultaneously, the controller 20 instructs the timer 21 to measure the time from latch of the data by the column latch 18. If a write command signal is not input before the elapse of a predetermined time, e.g., 0.4 ms, the data latched by the column latch 18 is invalidated and the controller 20 is returned to the READY state.

If the write command signal is input at the time t2 prior to the elapse of the predetermined time, the controller 20 shifts to the ERASE state to output an erase signal. At the same time, the controller 20 starts to operate the oscillator 22 through the timer 21, causing the oscillator 22 to output an oscillation signal to the $V_{PP}$ generator 19. Based on the control signal from the controller 20 and the oscillation signal from the oscillator 22, the $V_{PP}$ generator 19 generates the high voltage $V_{PP}$ synchronously with the erase signal.

The controller 20 instructs the timer 21 to measure the erase time and shifts to the WRITE state at the time t3 after the elapse of a predetermined time, e.g., 5 ms. In the WRITE state, after turning the erase signal to an L level, the controller 20 outputs a write signal at H level and also generates the high voltage $V_{PP}$ for writing. As a result, the same data latched by the full column latch 18 is delivered to all the bit lines 8b and is written into the memory cell 8c on the word line 8a selected by the row decoder 9, so that the same data is written to all the bytes in the page. Subsequently, the controller 20 causes the timer 21 to count the write time and shifts to the READY state at the time t4 after the elapse of a predetermined time, e.g., 5 ms. In the READY state, the controller 20 turns the write signal and the $V_{PP}$ generating signal to an L level and then turns the oscillation signal to an L level, thereby completing the write operation.

Figure 4:
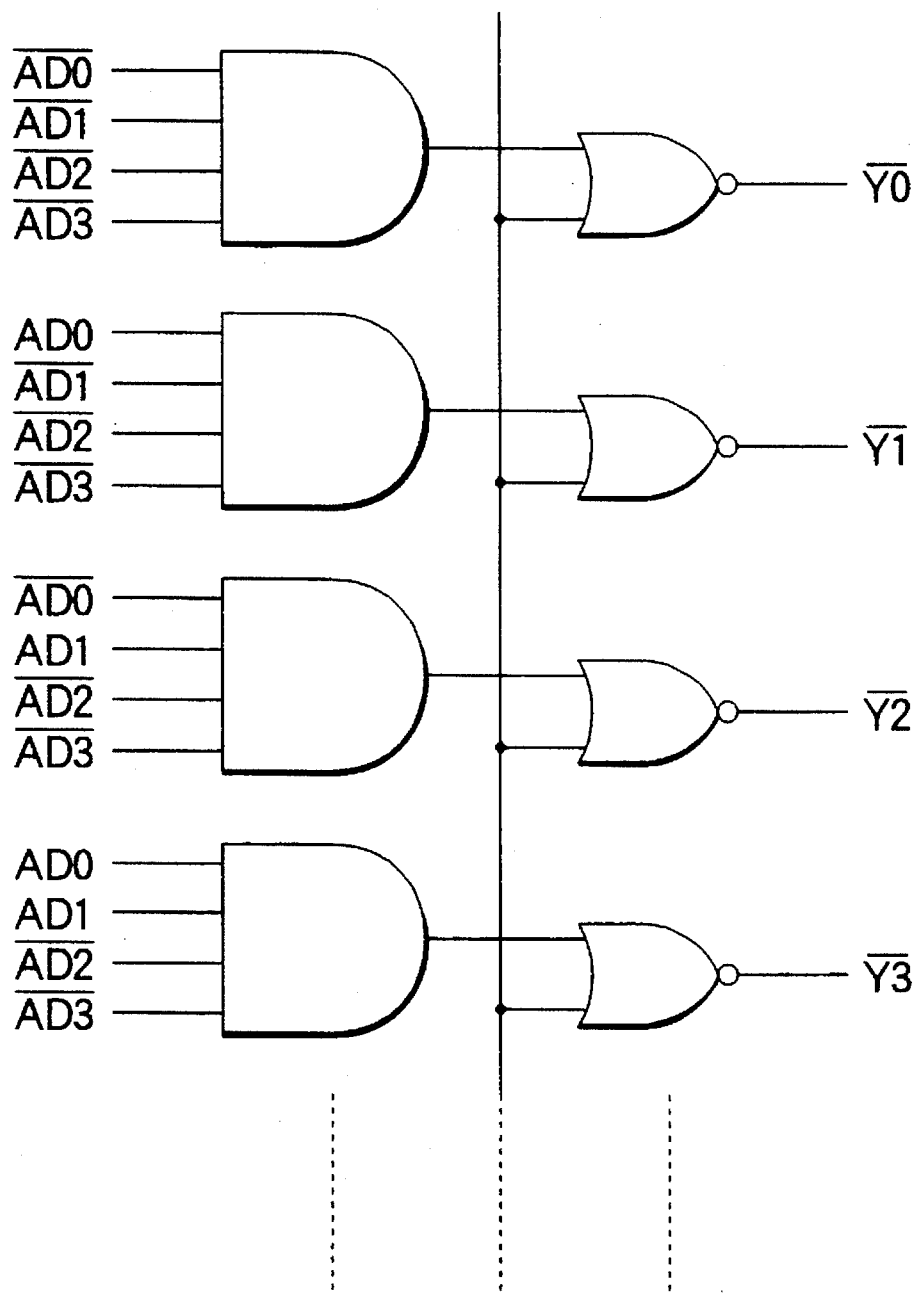
FIG. 4 is a logical circuit diagram of a column decoder for use in the EEPROM of Embodiment 1.

The operation of the column decoder 26 for selecting the full Y-gate 10 in response to the control signal from the control register 25 will be described below with reference to FIG. 4. FIG. 4 shows part of a circuit of the column decoder 26 for selecting the Y-gate 10 from four address data AD0 to AD3. Sets of the four address data AD0 to AD3 are introduced to a plurality of AND gates directly or after being inverted selectively, and each of the AND gates has an output connected to one input of a corresponding NOR gate. Introduced to the other input of each NOR gate is the control signal from the control register 25.

When selecting only one byte of the Y-gate 10, the control signal from the control register 25 is set to an L level, and only one of the plurality of AND gates is allowed to output an H level depending the states of the address data AD0 to AD3. Therefore, the NOR gate connected to that one AND gate outputs a signal of L level, whereby one byte of the Y-gate 10 is selected. On the other hand, when selecting the full Y-gate 10, the control signal from the control register 25 is set to an H level. Regardless of output levels from the AND gates, therefore, all the NOR gates output signals of L level and the full Y-gate 10 is selected.

EMBODIMENT 2

Figure 5:
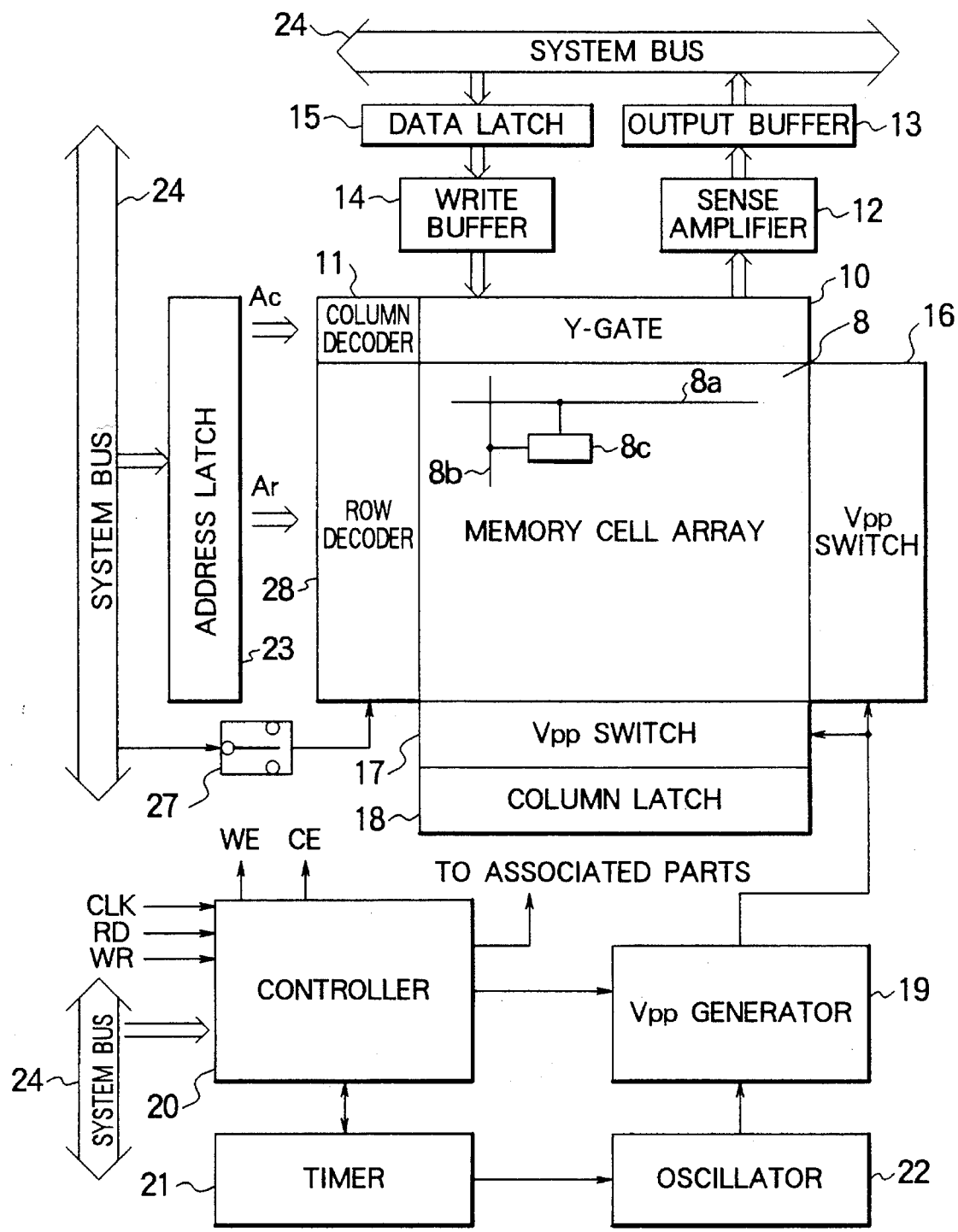
FIG. 5 is a structural block diagram showing an EEPROM according to Embodiment 2.
Figure 19:
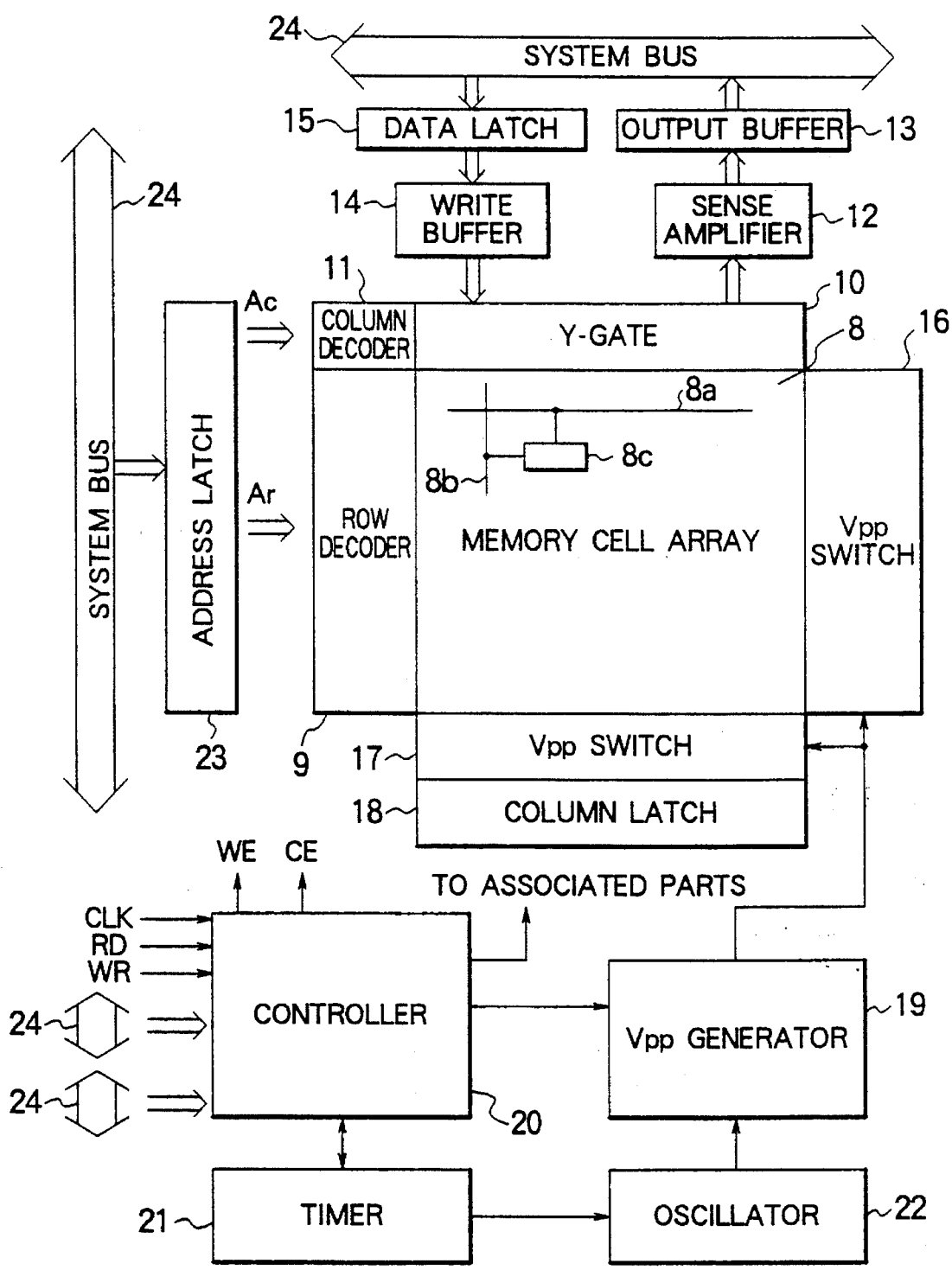
FIG. 19 is a structural block diagram showing a conventional EEPROM.

FIG. 5 shows the configuration of an EEPROM according to Embodiment 2. The EEPROM of this Embodiment 2 is different from the conventional EEPROM shown in FIG. 19 in that a row decoder 28 enabling all of the word lines to be selected is provided instead of the row decoder 9, and a row decoder control register 27 as a second control register is connected to the row decoder 28. In response to a second signal on the system bus 24, the control register 27 stores either the state where all the word lines 8a are selected or the state where address data is decoded and one word line is selected, and then transmits a control signal informing the row decoder 28 which state is stored. The sequence of write operations of the EEPROM progresses through four states, i.e., READY, LATCH, ERASE and WRITE, as with Embodiment 1.

Figure 6:
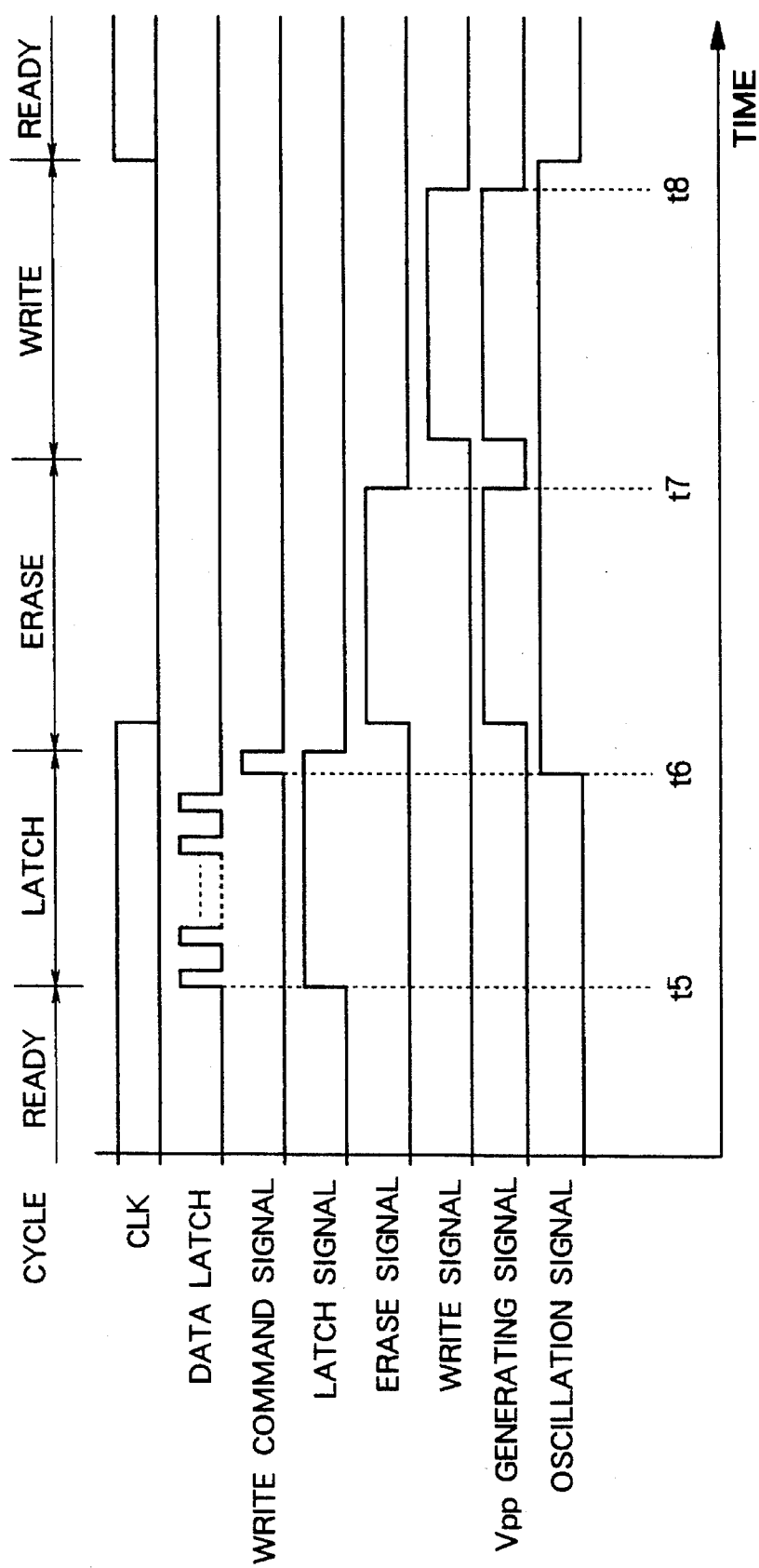
FIG. 6 is a timing chart showing the operation of the EEPROM of Embodiment 2.

The sequence of the write operation will be described below with reference to a timing chart of FIG. 6. When writing data latched by the column latch 18 over all the pages, the control register 27 connected to the row decoder 28 is set to the state of selecting all the word lines 8a in the READY state by using the second signal of H level on the system bus 24. Then, at the time t5, the latch signal is set to a H level to start the operation of repeating data latching as many times as correspond to the number of bytes in one page, whereupon the controller 20 shifts to the LATCH state. Simultaneously, the control let 20 instructs the timer 21 to measure the time from latching of the data by the column latch 18. If next data latch or write is not executed before the elapse of a predetermined time, e.g., 0.4 ms, the data latched by the column latch 18 is invalidated and the controller 20 is returned to the READY state.

On the other hand, if the next data latch is executed within the predetermined time, the timer is started again to measure the time. Then, if the write command signal is input at the time t6, the controller 20 shifts to the ERASE state to output an erase signal. At this time, address data Ar on the system bus 24 is latched by the address latch 23, and the latched address data Ar is input to the row decoder 28. But the row decoder 28 selects all the word lines 8a in response to the control signal from the control register 27 regardless of the address data Ar. Simultaneously with the latch of the address data, the controller 20 starts to operate the oscillator 22 through the timer 21, causing the oscillator 22 to output an oscillation signal to the $V_{PP}$ generator 19. Based on the $V_{PP}$ generating signal from the controller 20 and the oscillation signal from the oscillator 22, the $V_{PP}$ generator 19 generates the high voltage $V_{PP}$ in synch with the erase signal.

The controller 20 instructs the timer 21 to measure the erase time and shifts to the WRITE state at the time 17 after the elapse of a predetermined time, e.g., 5 ms. In the WRITE state, after turning the erase signal to an L level, the controller 20 outputs a write signal of H level and also generates the high voltage $V_{PP}$ for writing. As a result, the data latched by the column latch 18 is delivered to the bit lines 8b and is written into all the pages because the row decoder 28 selects all the word lines 8a in accordance with the output from the control register 27 at this time. Subsequently, the controller 20 instructs the timer 21 to count the write time and shifts to the READY state at the time 18 after the elapse of a predetermined time, e.g., 5 ms. In the READY state, the controller 20 turns the write signal and the $V_{PP}$ generating signal to an L level and then turns the oscillation signal to an L level, thereby completing the write operation.

Note that the function built in the row decoder 28 for selecting all the word lines 8a can be realized by connecting a plurality of AND gates and a plurality of NOR gates in a similar manner as in the column decoder of Embodiment 1 shown in FIG. 4.

EMBODIMENT 3

Figure 7:
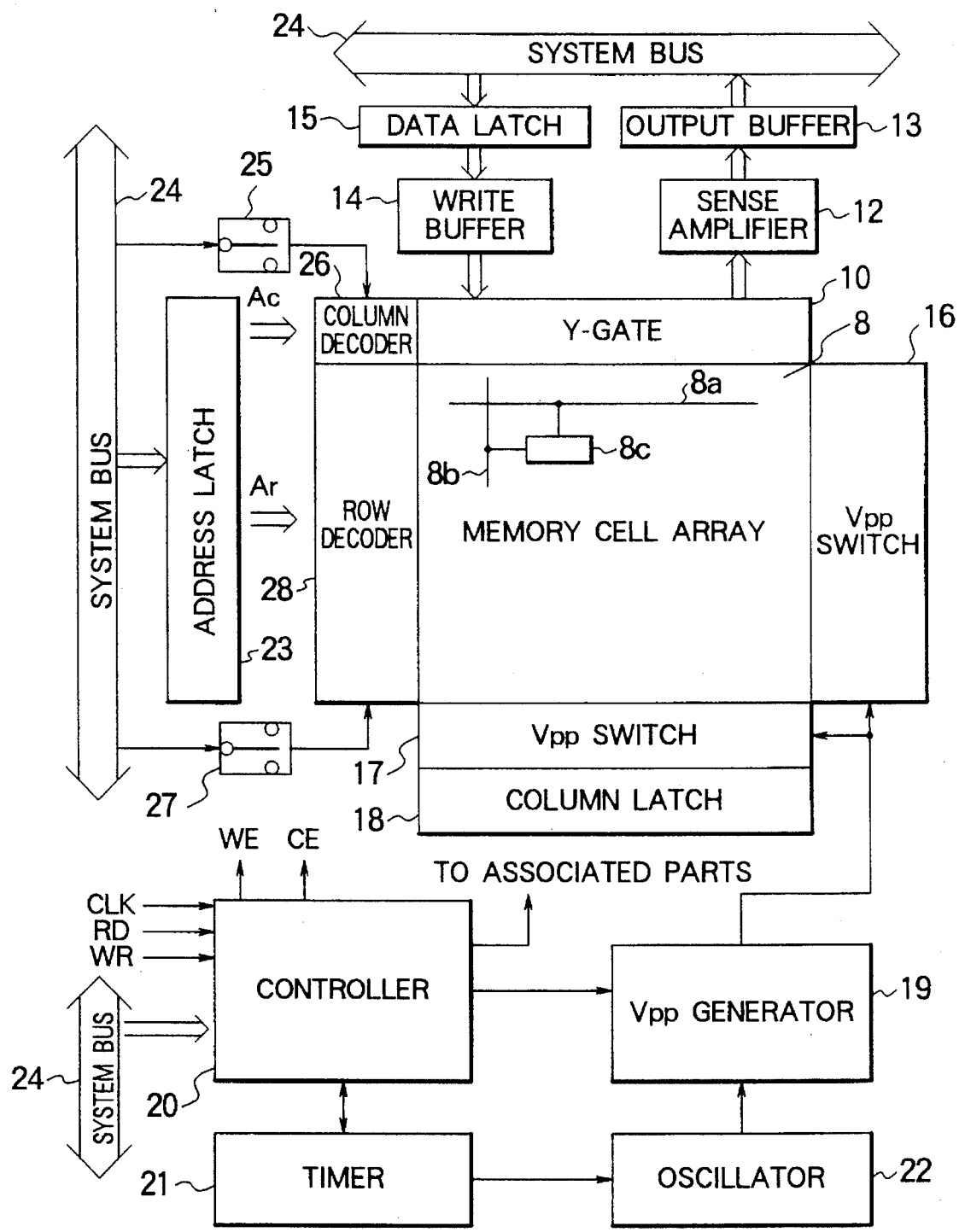
FIGS. 7 to 14 are structural block diagrams showing respectively EEPROMs according to Embodiments 3 to 10.

FIG. 7 shows the configuration of an EEPROM according to Embodiment 3. The EEPROM of this Embodiment 3 is different from the EEPROM of Embodiment 1 in that the row decoder 28 enabling all the word lines 8a to be selected is provided instead of the row decoder 9, and the row decoder control register 27 is connected to the row decoder 28. In other words, the full Y-gate 10 and all the word lines 8a can be selected respectively by the column decoder 26 and the row decoder 28.

The sequence of write operations to the EEPROM is a combination of both the sequences of Embodiments 1 and 2. In the READY state before starting the write operation, the column decoder control register 25 is set so as to select the full Y-gate 10, and the row decoder control register 27 is set so as to select all the word lines 8a. Since the column decoder 26 selects the full Y-gate 10, latching data causes the same data to be stored in the full column latch 18 by one byte of data latch. In the ERASE and WRITE cycles, since the row decoder 28 selects all the word lines 8a, the data in all the pages is erased and the data in the column latch 18 is written into all the pages. Thus, the same data is written into all areas of the memory by writing one byte data.

EMBODIMENT 4

Figure 8:
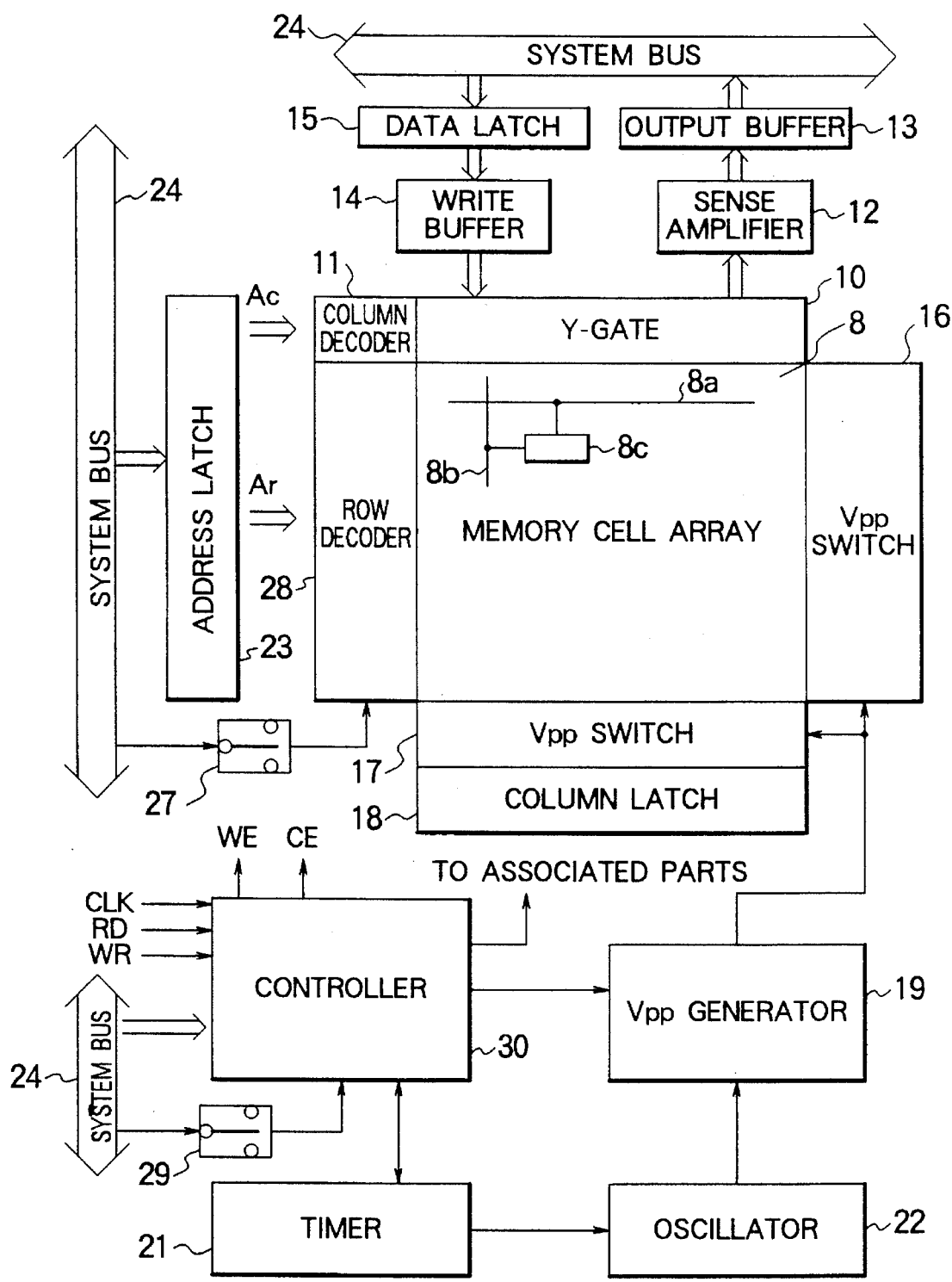

FIG. 8 shows the configuration of an EEPROM according Embodiment 4. The EEPROM of this Embodiment 4 is different from the EEPROM of Embodiment 2 shown in FIG. 5 in that a controller 30 is provided instead of the controller 20 and a supply control register 29 as a third control register is connected to the controller 30. In response to a third signal on the system bus 24, the supply control register 29 stores either the state where normal writing is executed or the state where a load is applied, and then transmits a control signal informing the controller 30 which state is stored.

When supplying the high voltage $V_{PP}$ to the word lines 8a to apply a load, the row decoder control register 27 is first set so as to select all the word lines 8a. Then, the supply control register 29 is set to the state of applying a load to the word lines 8a. By entering the write command signal after so setting the two control registers 27 and 29, the controller 30 starts to operate the oscillator 22 through the timer 21, causing the oscillator 22 to output an oscillation signal to the $V_{PP}$ generator 19. Based on the control signal from the controller 30 and the oscillation signal from the oscillator 22, the $V_{PP}$ generator 19 generates the high voltage $V_{PP}$ and supplies it to the $V_{PP}$ switch 16. Now since the row decoder 28 selects all the word lines 8a in response to the control signal from the row decoder control register 27 and the $V_{PP}$ switch 16 is turned on in response to the control signal from the controller 30, the high voltage $V_{PP}$ is applied to all the word lines 8a simultaneously. At the same time as turning on the $V_{PP}$ switch 16, the controller 30 instructs the timer 21 to measure the time during which the load is applied. If a predetermined time, e.g., 20 ms, runs out, the controller 30 turns off the $V_{PP}$ switch 16 and stops the operation of the $V_{PP}$ generator 19, thereby ending the impression of the high voltage $V_{PP}$.

EMBODIMENT 5

Figure 9:
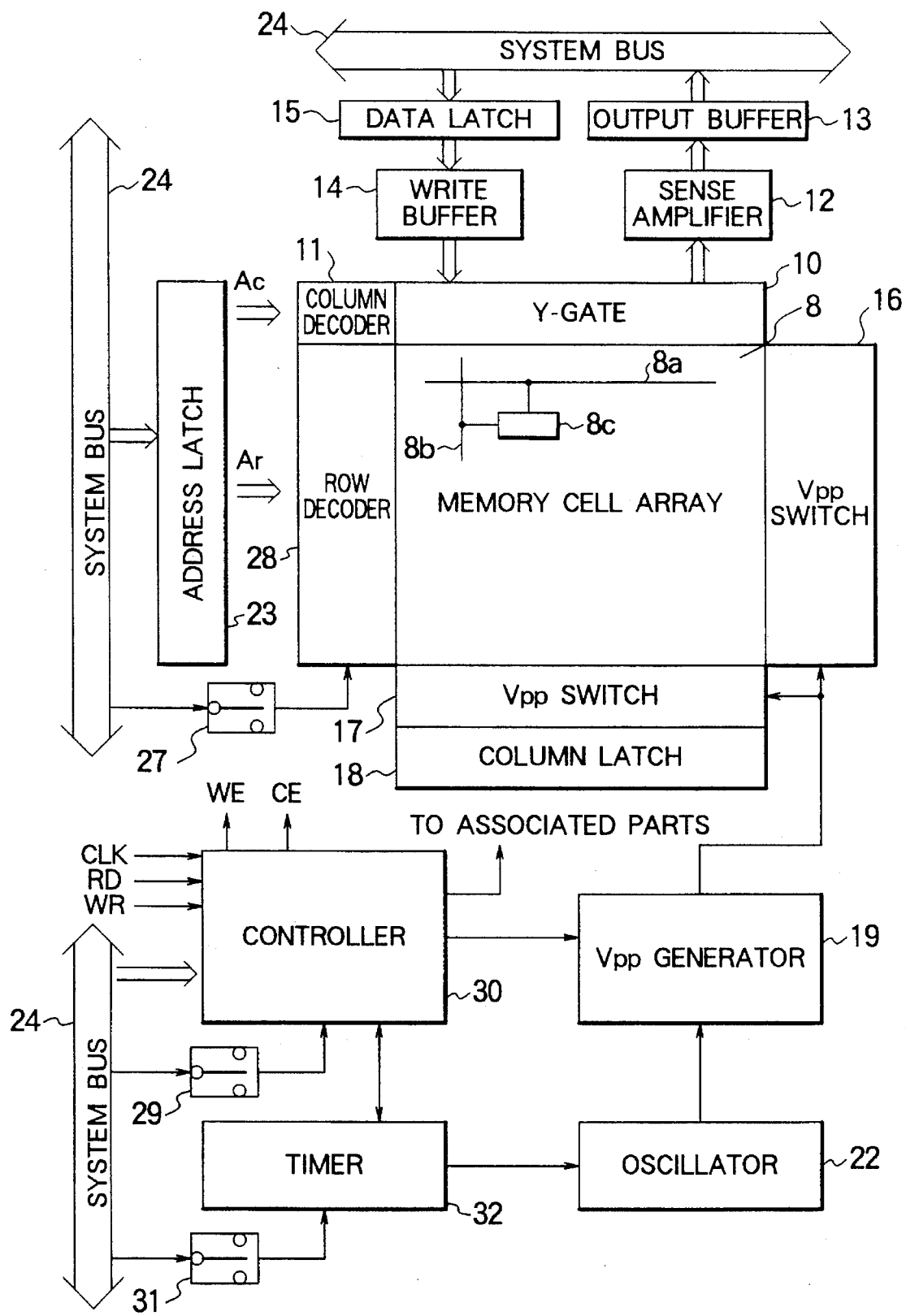

FIG. 9 shows the configuration of an EEPROM according to Embodiment 5. The EEPROM of this Embodiment 5 is different from the EEPROM of Embodiment 4 shown in FIG. 8 in that a timer 32 is provided instead of the timer 21 and a supply voltage switching control register 31 as a fourth control register is connected to the timer 32. The supply voltage switching control register 31 serves to switch a voltage applied to the word lines 8a. Specifically, in response to a fourth signal on the system bus 24, the register 31 stores one of the high voltage $V_{PP}$ and the source voltage $V_{DD}$, and then outputs a control signal informing the timer 32 which voltage is stored. Also, even if the control signal indicating the stored voltage is input to the timer 32 from the supply voltage switching control register 31, the setting by the supply voltage switching control register 31 is not valid unless the supply control register 29 connected to the controller 30 is set to the state of applying a load to the word lines 8a and the controller 30 executes control for applying the load.

A description will be first made of the case of supplying the voltage $V_{DD}$ to all the word lines 8a to apply a load. The row decoder control register 27 is set so as to select all the word lines 8a, the supply control register 29 is set so as to apply a load to the word lines 8a, and the supply voltage switching control register 31 is set to $V_{DD}$. By entering the write command signal to the controller 30 after so setting the three control registers 27, 29 and 31, the controller 30 instructs the timer 32 to start the operation of supplying the voltage to the $V_{PP}$ switch 16. But since the supply voltage switching control register 31 is now set to $V_{DD}$, the timer 32 does not output to the oscillator 22 an oscillation start signal for operating the oscillator 22 to generate the high voltage $V_{PP}$. With no oscillation start signal applied from the timer 32, the oscillator 22 cannot start oscillation, and with no oscillation signal applied from the oscillator 22, the $V_{PP}$ generator 19 cannot boost the voltage $V_{DD}$ to generate the high voltage $V_{PP}$. Therefore, when a control signal for supplying the voltage is input to the $V_{PP}$ switch 16 from the controller 30, the voltage $V_{DD}$ is supplied to the $V_{PP}$ switch 16. Now since the row decoder 28 selects all the word lines 8a in response to the control signal from the row decoder control register 27 and the $V_{PP}$ switch 16 is turned on in response to the control signal from the controller 30, the voltage $V_{DD}$ is applied to all the word lines 8a. At the same time as turning on the $V_{PP}$ switch 16, the controller 30 instructs the timer 32 to measure the time during which the voltage is applied. If a predetermined time, e.g., 20 ms, runs out, the controller 30 turns off the $V_{PP}$ switch 16 and stops the operation of the $V_{PP}$ generator 19, thereby ending the impression of the voltage $V_{DD}$.

Next, a description will be given of supplying the high voltage $V_{PP}$ to all the word lines 8a to apply a load. In this case, the row decoder control register 27 is set so as to select all the word lines 8a, the supply control register 29 is set so as to apply a load to the word lines 8a, and the supply voltage switching control register 31 is set to $V_{PP}$. By entering the write command signal to the controller 30 after so setting the three control registers, the high voltage $V_{DD}$ is supplied to all the word lines 8a. This process is different from the above one for applying the voltage $V_{DD}$ as follows. Upon start of the control for applying the supply voltage to the timer 32 from the controller 30, since the supply voltage switching control register 31 is now set to the high voltage $V_{PP}$, the timer 32 outputs an oscillation start signal to the oscillator 22, whereupon the oscillator 22 is oscillated to operate the $V_{PP}$ generator 19. Then, the high voltage $V_{PP}$ is applied to the $V_{PP}$ switch 16 under control of the controller 30. The remaining operation is the same as in the above case of applying the voltage $V_{DD}$ to all the word lines 8a.

EMBODIMENT 6

Figure 10:
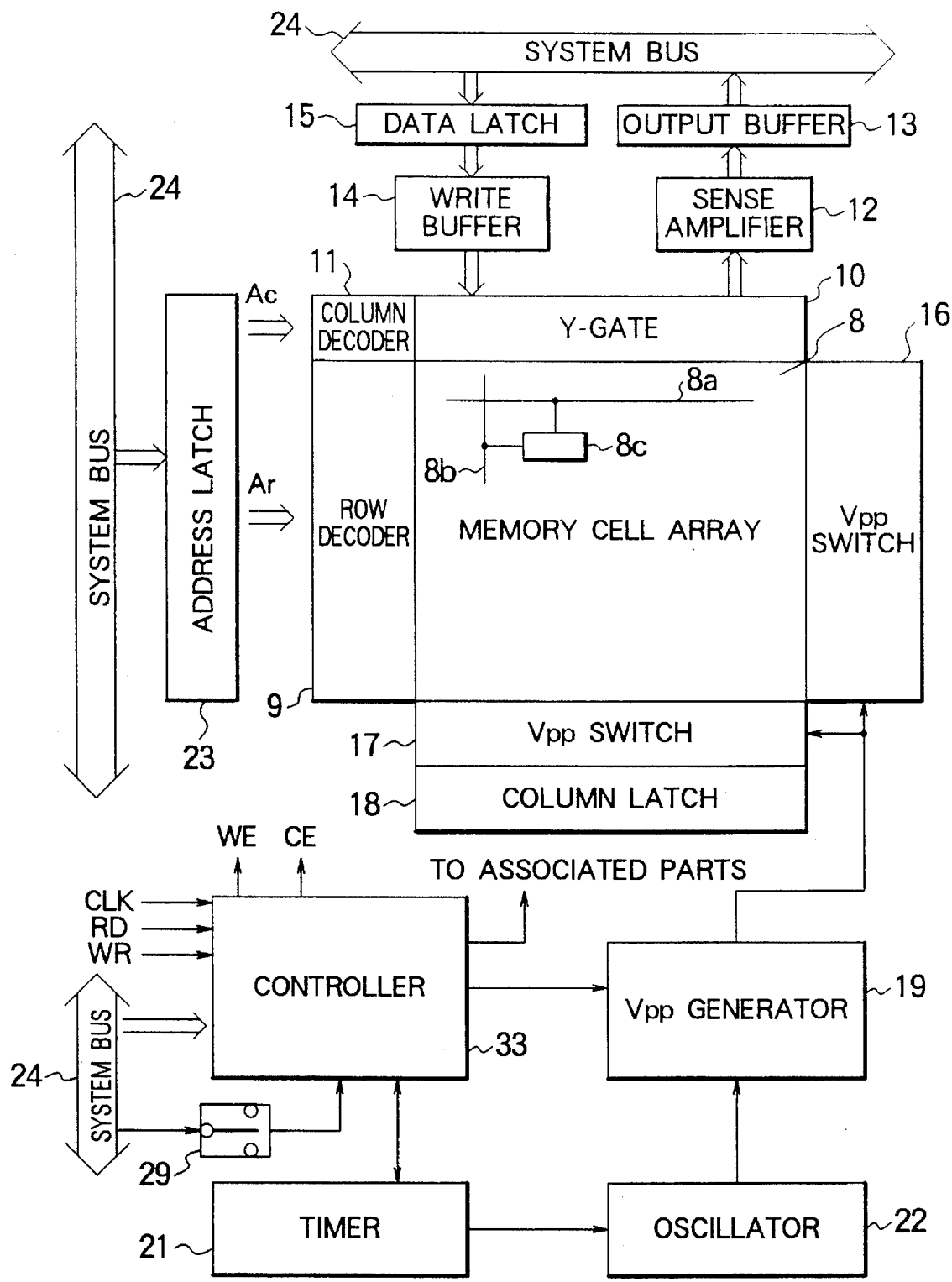

FIG. 10 shows the configuration of an EEPROM according to Embodiment 6. The EEPROM of this Embodiment 6 is different from the conventional EEPROM shown in FIG. 19 in that a controller 33 is provided instead of the controller 20 and the supply control register 29 as a third control register is connected to the controller 33. This EEPROM is capable of applying the high voltage $V_{PP}$ to all the bit lines 8b. The supply control register 29 stores either the state where normal writing is executed or the state where a load is applied, and then outputs a control signal informing the controller 33 which state is stored.

When supplying the high voltage $V_{PP}$ to the bit lines 8b to apply a load, the supply control register 29 is set to the state of applying a load. Then, by entering the write command signal after so setting the control register 29, the controller 33 starts to operate the oscillator 22 through the timer 21, causing the oscillator 22 to output an oscillation signal to the $V_{PP}$ generator 19. Based on the control signal from the controller 33 and the oscillation signal from the oscillator 22, the $V_{PP}$ generator 19 generates the high voltage $V_{PP}$ and supplies it to the $V_{PP}$ switch 17. Now the full $V_{PP}$ switch 17 for all the bit lines 8b is turned on in response to a control signal from the controller 33 and the high voltage $V_{PP}$ is applied to all the bit lines 8b. At the same time as turning on the $V_{PP}$ switch 17, the controller 33 instructs the timer 21 to measure the time during which the voltage is applied. If a predetermined time, e.g., 20 ms, runs out, the controller 33 turns off the $V_{PP}$ switch 17 and stops the operation of the $V_{PP}$ generator 19, thereby ending the impression of the high voltage $V_{PP}$.

EMBODIMENT 7

Figure 11:
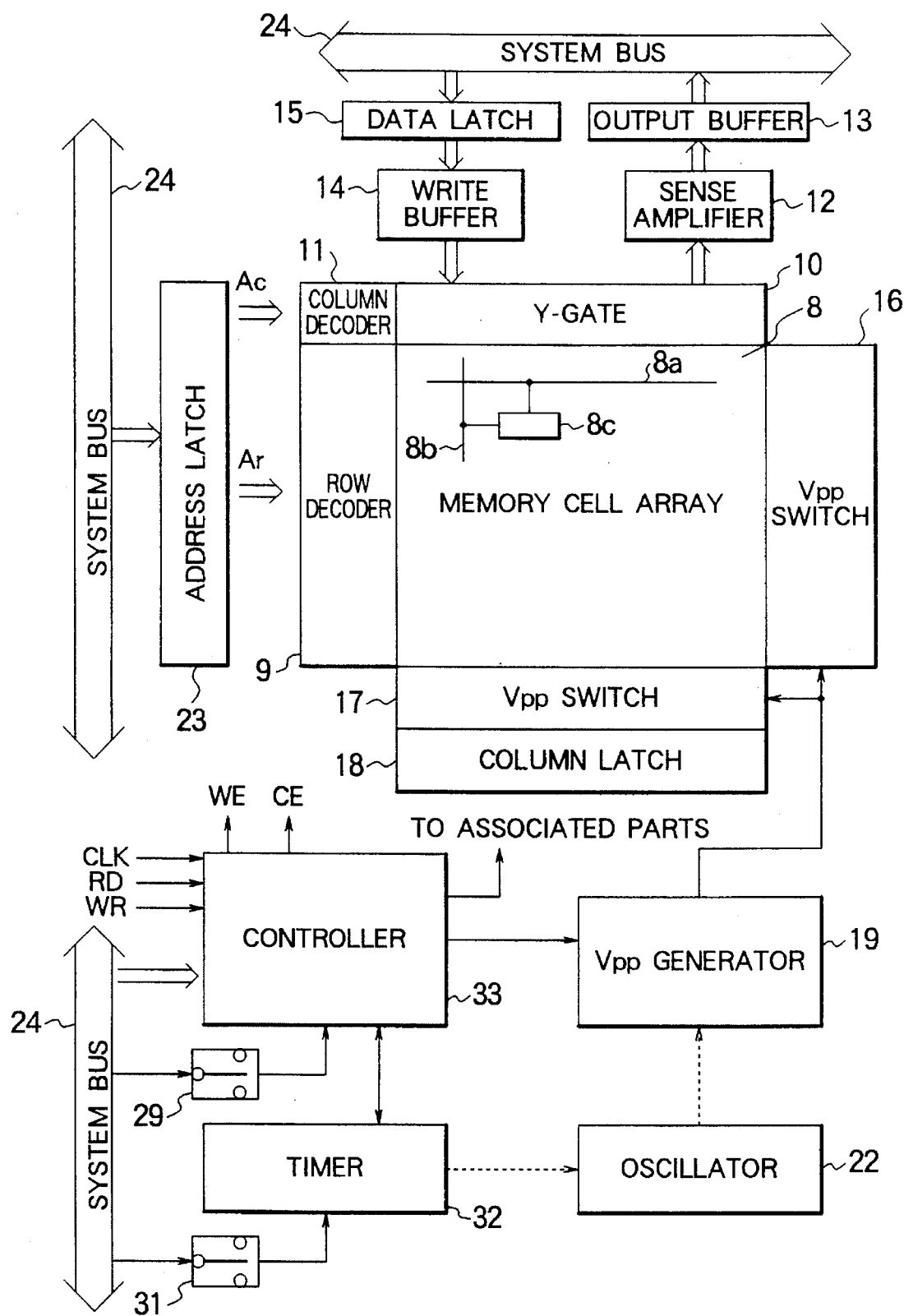

FIG. 11 shows the configuration of an EEPROM according to Embodiment 7. The EEPROM of this Embodiment 6 is different from the EEPROM of Embodiment 6 shown in FIG. 10 in that a timer 32 is provided instead of the timer 21 and a supply voltage switching control register 31 as a fourth control register is connected to the timer 32. The supply voltage switching control register 31 serves to switch a voltage applied to the bit lines 8b. Specifically, in response to a fourth signal on the system bus 24, the register 31 stores one of the high voltage $V_{PP}$ and the source voltage $V_{DD}$, and then outputs a control signal informing the timer 32 which voltage is stored. Also, even if the control signal indicating the stored voltage is input to the timer 32 from the switching control register 31, the setting by the switching control register 31 is not valid unless the supply control register 29 connected to the controller 33 is set to the state of applying a load to the bit lines 8b and the controller 33 executes control for applying the load.

A description will be first made of the case of supplying the voltage $V_{DD}$ to all the bit lines 8b to apply a load. The supply control register 29 is set so as to apply a load to the bit lines 8b, and the supply voltage switching control register 31 is set to $V_{DD}$. By entering the write command signal to the controller 33 after so setting the two control registers 29 and 31, the controller 33 instructs the timer 32 to start the operation of supplying the voltage to the $V_{PP}$ switch 17. But since the supply voltage switching control register 31 is now set to $V_{DD}$, the timer 32 does not output to the oscillator 22 an oscillation start signal for operating the oscillator 22 to generate the high voltage $V_{PP}$. With no oscillation start signal applied from the timer 32, the oscillator 22 cannot start oscillation, and with no oscillation signal applied from the oscillator 22, the $V_{PP}$ generator 19 cannot boost the voltage $V_{DD}$ to generate the high voltage $V_{PP}$. Therefore, when a control signal for supplying the voltage is input to the $V_{PP}$ switch 17 from the controller 33, the voltage $V_{DD}$ is supplied to the $V_{PP}$ switch 17. Now the $V_{PP}$ switch 17 is turned on in response to the control signal from the controller 33 and the voltage $V_{DD}$ is applied to all the bit lines 8b. At the same time as turning on the $V_{PP}$ switch 17, the controller 33 instructs the timer 32 to measure the time during which the voltage is applied. If a predetermined time, e.g., 20 ms, runs out, the controller 33 turns off the $V_{PP}$ switch 17 and stops the operation of the $V_{PP}$ generator 19, thereby ending the impression of the voltage $V_{DD}$.

Next, a description will be made of the case of supplying the high voltage $V_{PP}$ to all the bit lines 8b to apply a load. In this case, the supply control register 29 is set so as to apply a load to the word lines 8a and the supply voltage switching control register 31 is set to $V_{PP}$. By entering the write command signal to the controller 33 after so setting those control registers, the high voltage $V_{PP}$ is supplied to all the bit lines 8b. This process is different from the above one for applying the voltage $V_{DD}$ as follows. Upon start of the control for applying the supply voltage to the timer 32 from the controller 33, since the supply voltage switching control register 31 is now set to the high voltage $V_{PP}$, the timer 32 outputs an oscillation start signal to the oscillator 22, whereupon the oscillator 22 is oscillated to operate the $V_{PP}$ generator 19. Then, the high voltage $V_{PP}$ is applied to the $V_{PP}$ switch 16 under control of the controller 33. The remaining operation is the same as in the above case of applying the voltage $V_{DD}$ to all the bit lines 8b.

EMBODIMENT 8

Figure 12:
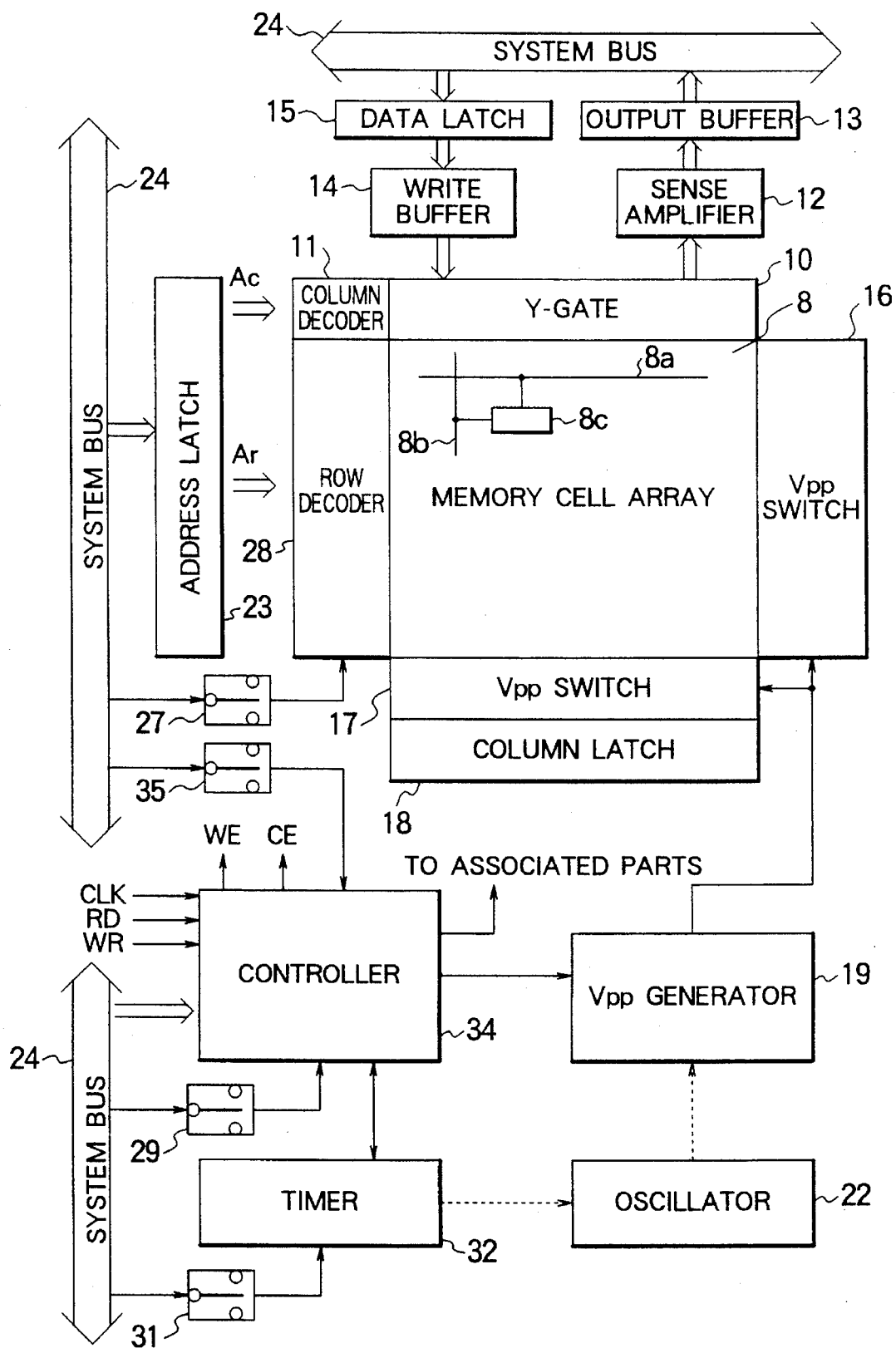

FIG. 12 shows the configuration of an EEPROM according to Embodiment 8. The EEPROM of this Embodiment 8 is different from the EEPROM of Embodiment 5 shown in FIG. 9 in that a controller 34 is provided instead of the controller 30, and the supply control register 29 as a third control register and a select register 35 as a fifth control register are connected to the controller 34. In response to a fifth signal on the system bus 24, the select register 35 stores either the state where the bit lines 8b are selected or the state where the word lines 8a are selected, and then outputs a control signal informing the controller 34 which state is stored.

The sequence of applying the high voltage $V_{PP}$ or the source voltage $V_{DD}$ to all the word lines 8a or all the bit lines 8b is the same as in above Embodiments 5 and 7. The EEPROM of this Embodiment 8 is capable of applying either voltage to desired ones of the word lines 8a and the bit lines 8b, and the select register 35 connected to the controller 34 sets which of the word lines 8a and the bit lines 8b are selected.

When applying the voltage to all the word lines 8a, the write command signal is input to the controller 34 after properly setting the row decoder control register 27, the supply control register 29, the supply voltage switching control register 31 and the select register 35. Then, the controller 34 instructs the timer 32 and the $V_{PP}$ generator 19 to apply the supply voltage to the $V_{PP}$ switch 16. The supply voltage applied at this time is the high voltage $V_{PP}$ or the source voltage $V_{DD}$ that is set by the supply voltage switching control register 31. Further, the controller 34 turns on the $V_{PP}$ switch 16 and the row decoder 28 selects all the word lines 8a in accordance with the setting of the row decoder control register 27. As a result, the high voltage $V_{PP}$ or the source voltage $V_{DD}$ is applied to all the word lines 8a.

On the other hand, when applying the voltage to all the bit lines 8b, the write command signal is input to the controller 34 after properly setting the supply control register 29, the supply voltage switching control register 31 and the select register 35. Then, the controller 34 instructs the timer 32 and the $V_{PP}$ generator 19 to apply the supply voltage to the $V_{PP}$ switch 17, and also turns on the $V_{PP}$ switch 17. As a result, the high voltage $V_{PP}$ or the source voltage $V_{DD}$ is applied to all the bit lines 8b.

EMBODIMENT 9

Figure 13:
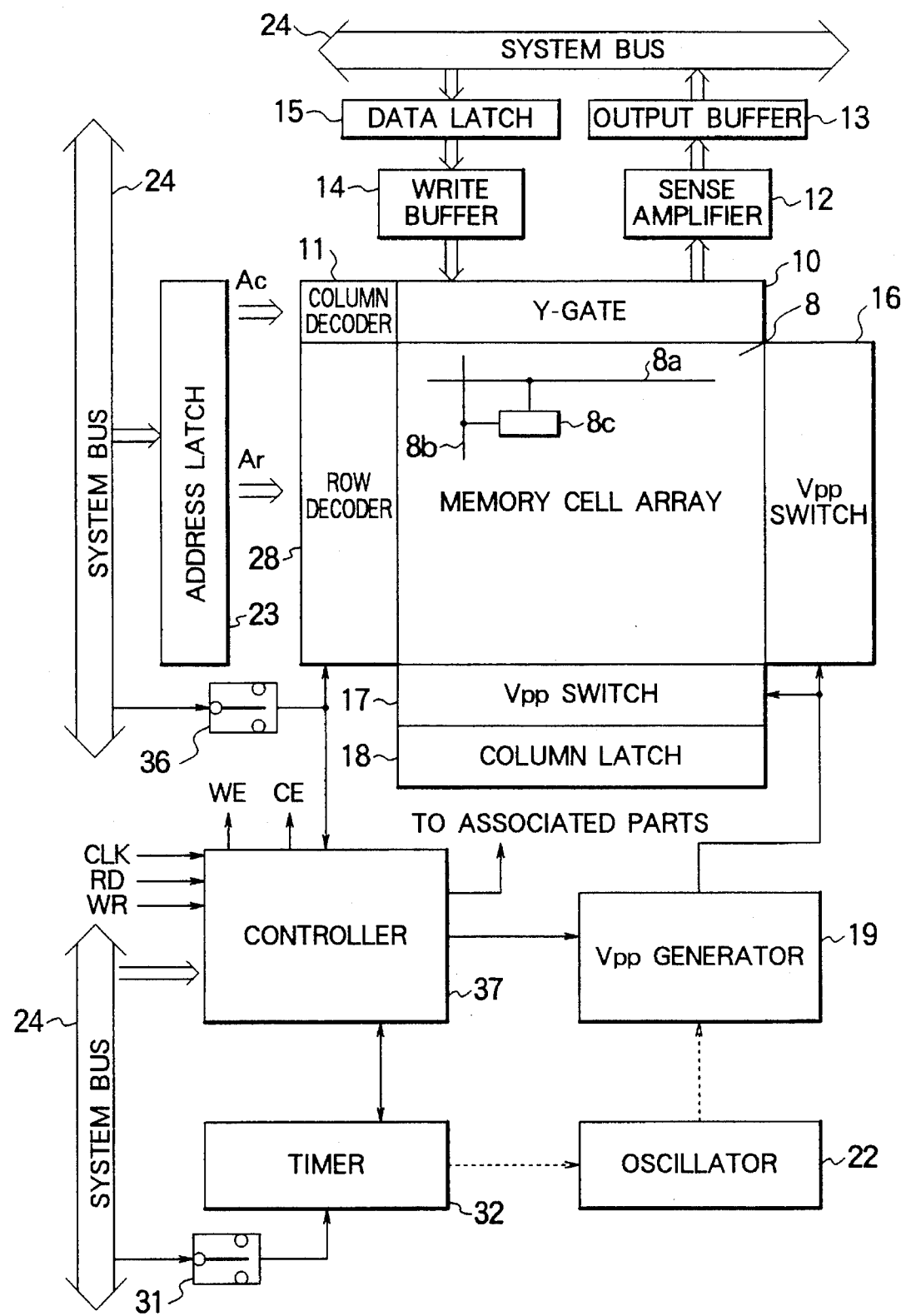

FIG. 13 shows the configuration of an EEPROM according to Embodiment 9. The EEPROM of this Embodiment 9 is different from the EEPROM of Embodiment 8 shown in FIG. 12 in that a controller 37 is provided instead of the controller 34, and a control register 36 as a sixth control register is connected instead of the row decoder control register 27, the supply control register 29 and the select register 35 to the controller 37. The control register 36 stores a state indicating whether a voltage is applied to all the word lines 8a and all the bit lines 8b, and then outputs a control signal informing the row decoder 28 and the controller 37 which state is stored. In accordance with the control signal from the control register 36, the row decoder 28 selects whether or not all the word lines 8a are selected, and the controller 37 controls the timer 32 and the $V_{PP}$ generator 19.

The EEPROM of this Embodiment operates as follows. The control register 36 is set to apply a voltage, the switching control register 31 is set to $V_{PP}$ or $V_{DD}$, and thereafter the write command signal is input to the controller 37. Then, the row decoder 28 selects all the word lines 8a in response to the control signal from the control register 26, and the controller 34 instructs the timer 32 and the $V_{PP}$ generator 19 to apply the high voltage $V_{PP}$ or the source voltage $V_{DD}$ to the $V_{PP}$ switch 16 and the $V_{PP}$ switch 17. The controller 37 also turns on the $V_{PP}$ switch 16 and the $V_{PP}$ switch 17. As a result, the high voltage $V_{PP}$ or the source voltage $V_{DD}$ is applied to all the word lines 8a and all the bit lines 8b simultaneously.

EMBODIMENT 10

Figure 14:
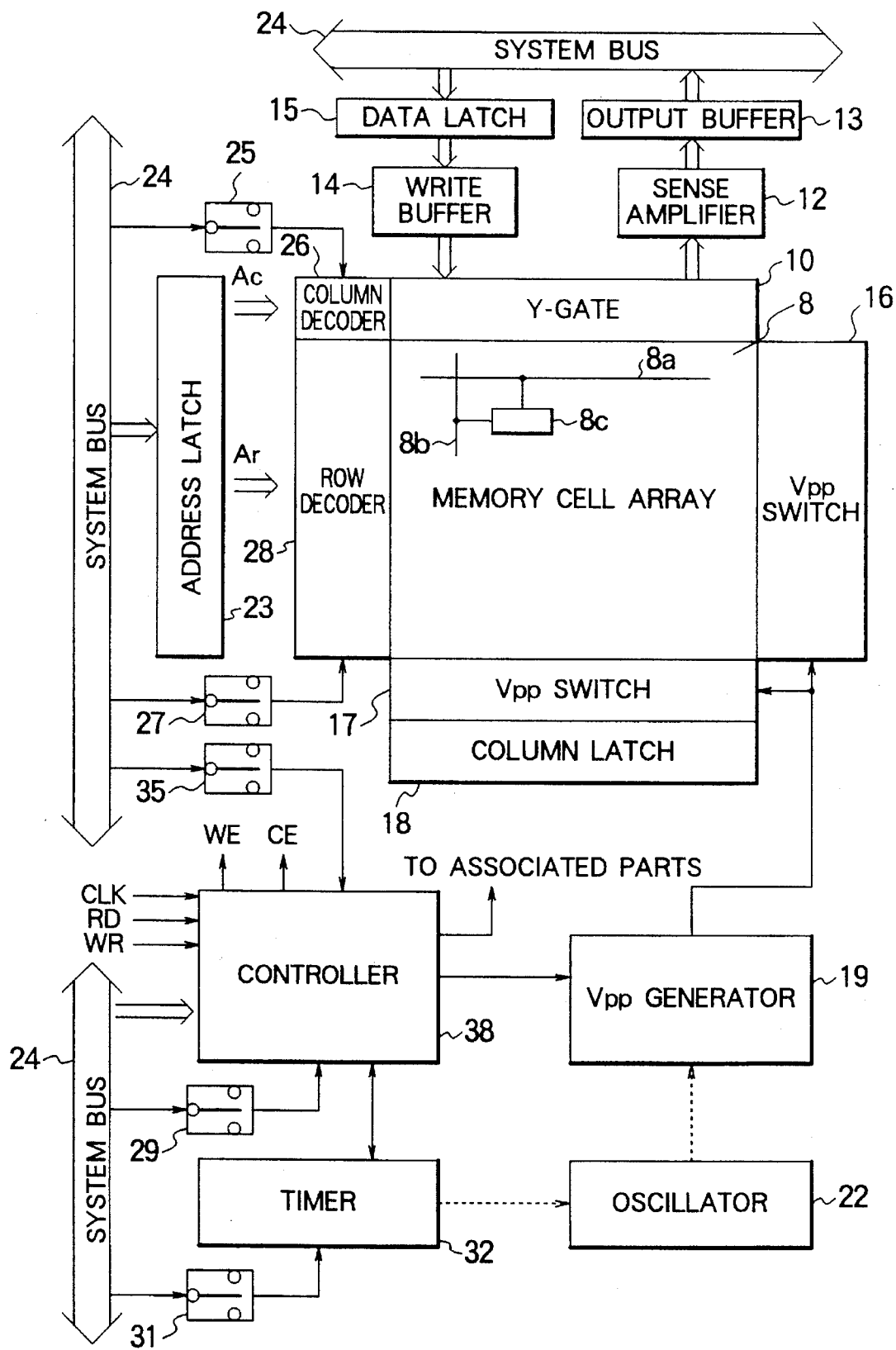

FIG. 14 shows the configuration of an EEPROM according to Embodiment 10. The EEPROM of this Embodiment 10 is different from the EEPROM of Embodiment 8 shown in FIG. 12 in that the column decoder 26 enabling the full Y-gate 10 to be selected is provided instead of the column decoder 11, the column decoder control register 25 as a first control register is connected to the column decoder 26, and a controller 38 is provided instead of the controller 34. The supply control register 29 is connected to the controller 38.

The EEPROM of this Embodiment 10 has combined functions of both the EEPROMs of Embodiments 3 and 8, and realizes various write control methods depending on the setting of the five control registers 25, 27, 29, 31 and 35. Any of the write control methods is carried out by setting the five control registers so as to realize the desired function, and then applying the write command signal to the controller 38. When writing the same data into all the memory cells 8c, for example, the column decoder control register 25 and the row decoder control register 27 are set respectively to select the full Y-gate 10 and all the word lines 8a, the supply control register 29 is set to execute normal writing, and the write command signal is applied to the controller 38. As a result, the same data is written into all the memory cells 8c.

Figure 15:
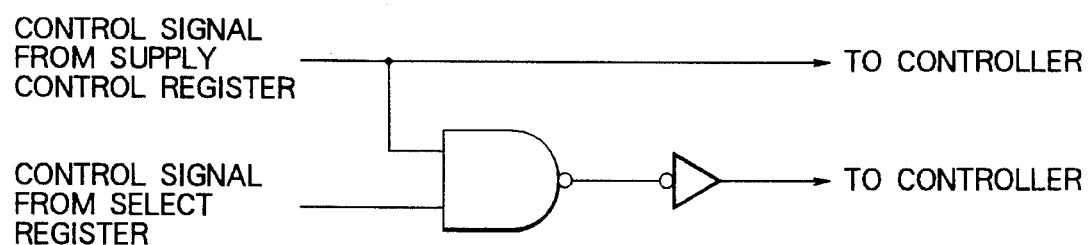
FIG. 15 is a logical circuit diagram showing part of a controller for use in Embodiment 10.

At this time, since the supply control register 29 is set to execute normal writing without applying a load, the set value of the switching control register 31 for selecting the high voltage $V_{PP}$ or the source voltage $V_{DD}$ and the set value of the select register 35 for selecting the word lines 8a or the bit lines 8b are all made invalid. FIG. 15 shows a logical circuit for invalidating the set value of the select register 35. The logical circuit is provided in the controller 38, and comprises a NAND gate to which a control signal from the supply control register 29 and a control signal from the select register 35 are input, and an inverter connected to the NAND gate.

When the supply control register 29 is set to apply a load, it outputs a control signal of H level, allowing the set value of the select register 35 for selecting the word lines 8a or the bit lines 8b to be transmitted to the controller 38 only under that condition. More specifically, when the control signal from the supply control register 29 is at an H level, i.e., in the case of applying a load, if the control signal from the select register 35 is at H level, the output of the NAND gate takes L level and a signal of H level is applied from the inverter to the controller. On the other hand, if the control signal from the select register 35 is at L level, the output of the NAND gate takes H level and a signal of L level is applied from the inverter to the controller. However, when the control signal from the supply control register 29 is at L level, i.e., in the case of executing normal writing, the output of the NAND gate is always H level regardless of the level of the control signal from the select register 35, and a signal of L level is applied from the inverter to the controller. Thus, the set value of the select register 35 is made invalid.

A description will now be given of applying the high voltage $V_{PP}$ to all the word lines 8a in the EEPROM of Embodiment 10. First, the row decoder control register 27 is set so as to select all the word lines 8a, and the select register 35 for selecting the word lines 8a or the bit lines 8b is set so as to select the bit lines 8b. Also, the select register 31 for selecting the applied voltage is set to the high voltage $V_{PP}$, and the supply control register 29 is set to apply a load. Then, the write command signal is input to the controller 38 under the above condition, whereupon the controller 38 instructs the timer 32 and the $V_{PP}$ generator 19 to supply the high voltage $V_{PP}$ to the $V_{PP}$ switch 16. Since the row decoder 28 now selects all the word lines 8a, the high voltage $V_{PP}$ is applied to all the word lines 8a upon the controller 38 turning on the $V_{PP}$ switch 16.

EMBODIMENT 11

Figure 16:
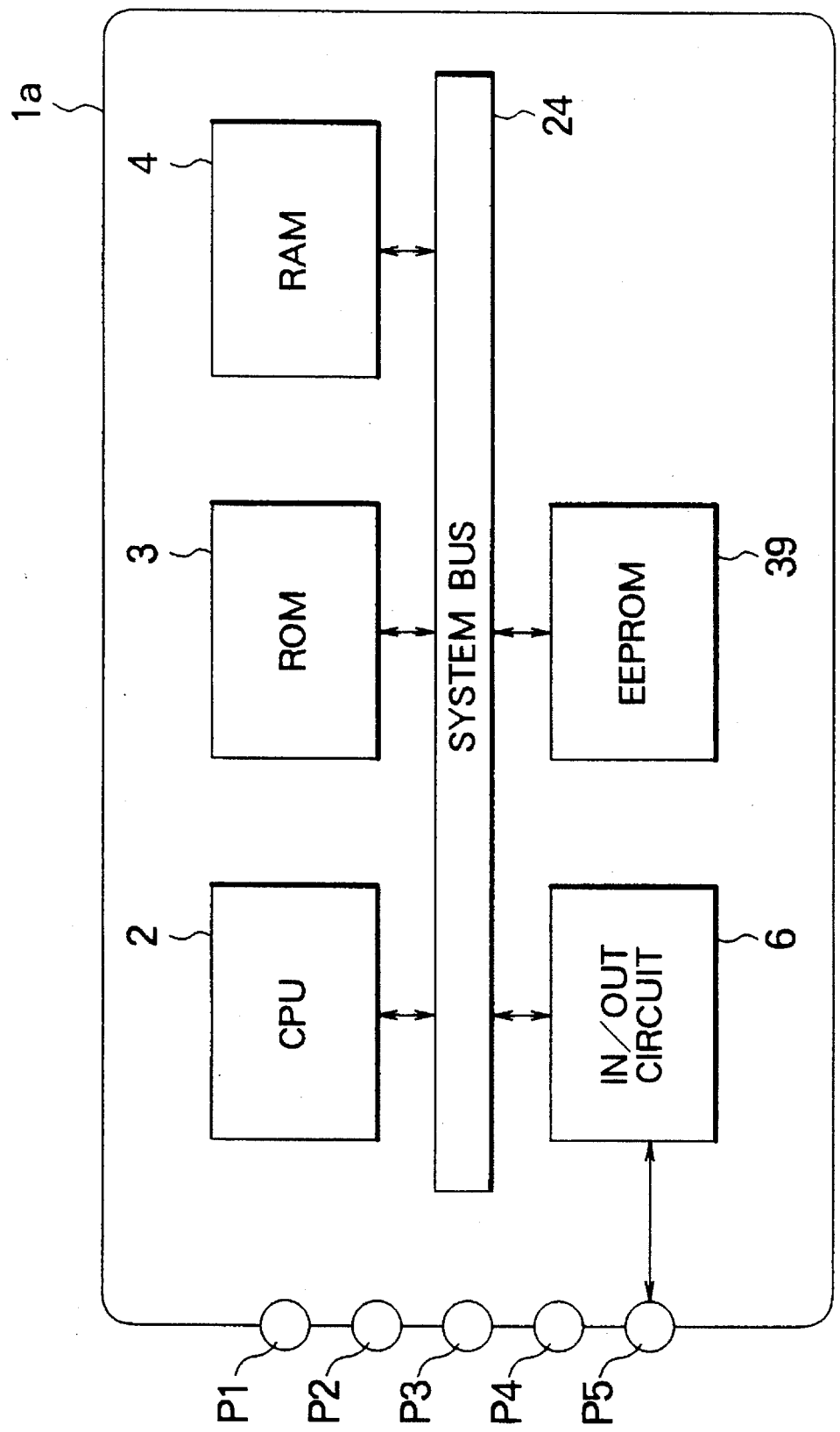
FIG. 16 is a structural block diagram showing an IC card according to Embodiment 11.

FIG. 16 shows the configuration of an IC card according to Embodiment 11. An IC card 1a includes a CPU 2 for processing data, to which a masked ROM 3, a RAM 4, an EEPROM 39 and an input/output circuit 6 are connected through a system bus 24. The masked ROM 3 stores processing programs for executing various functions of the IC card 1a, the RAM 4 stores data temporarily required, and the EEPROM 39 stores various information required to be always stored, results of processing data, etc. The input/output circuit 6 controls transfer of data between the IC card 1a and the exterior. Specifically, the input/output circuit 6 performs parallel/-serial conversion of parallel data on the system bus 24 in accordance with an instruction from the CPU 2 and outputs the resultant serial data through an I/O terminal P5. The input/output circuit 6 also performs serial/parallel conversion of serial data input through the I/O terminal PS. Further, denoted by P1 is a $V_{DD}$ terminal, P2 is a GND terminal, P3 is a reset input terminal (RST terminal) for initializing the IC card 1a, and P4 is a clock terminal (CLK terminal) through which an external clock signal $X_{IN}$ is input.

Figure 17:
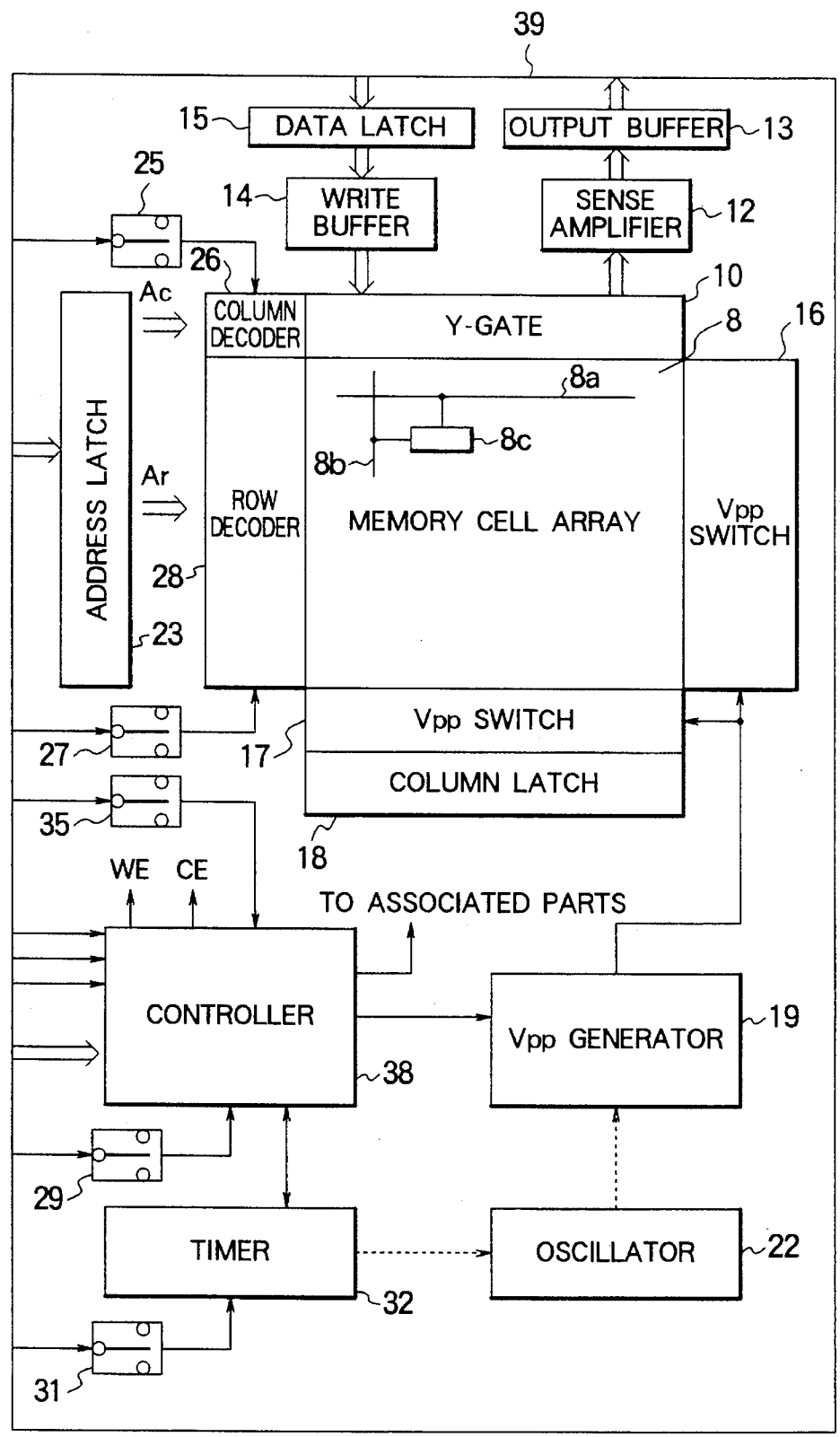
FIG. 17 is a structural block diagram showing an EEPROM for use in the IC card of Embodiment 11.
Figure 18:
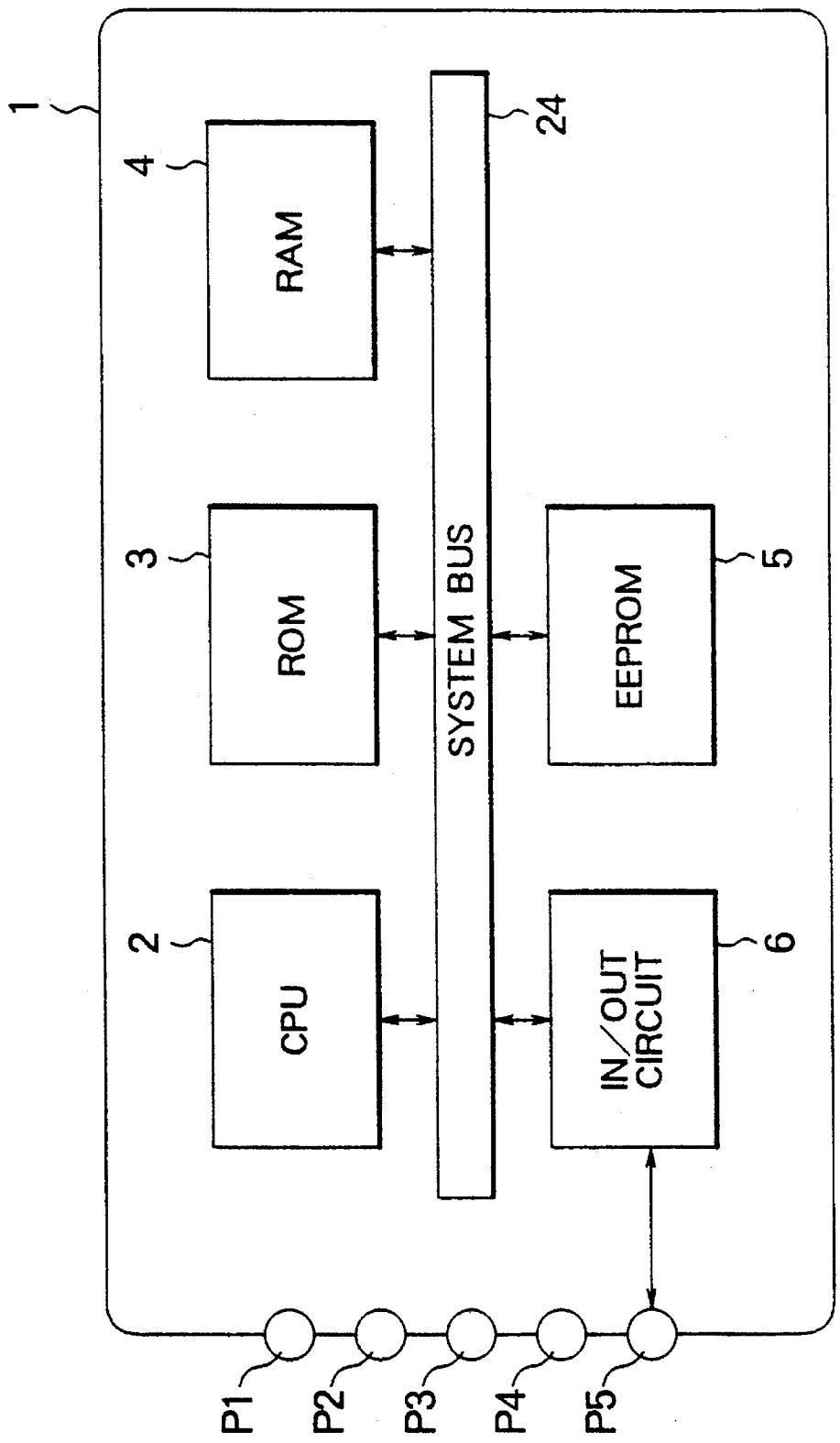
FIG. 18 is a structural block diagram showing a conventional IC card.

FIG. 17 is a structural block diagram of the EEPROM 39. The EEPROM 39 is of the same configuration as the EEPROM according to Embodiment 10 shown in FIG. 14. The EEPROM 39 is controlled by the CPU 2. Specifically, the CPU 2 transfers data to and from the exterior through the input/output circuit 6. When an instruction is applied from the exterior to perform any of various functions of the EEPROM 39, an instruction signal is transmitted to the EEPROM 39 through the system bus 24, whereupon a desired one of various operations is executed.

When writing the same data into all the memory cells 8c of the EEPROM 39, control data is first serially input to the IC card through the I/O terminal P5. Then, the serial data is converted into parallel data in the input/output circuit 6, and the parallel control data is received by the CPU 2 through the system bus 24. The CPU 2 decodes the received control data, sets the column decoder control register 25 and the row decoder control register 27 so as to select the full Y-gate 10 and all the word lines 8a, respectively, and sets the supply control register 29 so as to execute normal writing. Further, the CPU 2 instructs the column latch 18 to latch one byte of data, and then applies a write command signal to the controller 38. Correspondingly, the controller 38 controls various functions so that the same data is written into all the memory cells 8c.

What is claimed is:

1. An EEPROM having a page write function to enable plural bytes of data to be written simultaneously, comprising:

a memory cell array having a plurality of memory cells connected to a plurality of bit lines and a plurality of word lines, a column decoder for bit line selection, a row decoder for word line selection, a first control register for, in accordance with a first signal externally applied, storing a state indicating whether one byte of the bit lines or all of the bit lines are selected, and informing said column decoder which state is stored, a column latch for latching data, and a controller for instructing said column latch to latch data externally applied, and writing the latched data into the memory cells connected to one byte or all of the bit lines and the word line respectively selected by said column decoder and said row decoder.

2. An EEPROM having a page write function to enable plural bytes of data to be written simultaneously, comprising:

a memory cell array having a plurality of memory cells connected to a plurality of bit lines and a plurality of word lines, a column decoder for bit line selection, a row decoder for word line selection, a first control register for, in accordance with a first signal externally applied, storing a state indicating whether one of the word lines or all of the word lines are selected, and informing said row decoder which state is stored, a column latch for latching data, and a controller for instructing said column latch to latch data externally applied, and writing the latched data into the memory cells which are connected to the bit lines and one or all of the word lines respectively selected by said column decoder and said row decoder.

3. The EEPROM according to claim 2, comprising a second control register for, in accordance with a second signal externally applied, storing a state indicating to whether one byte of the bit lines or all the bit lines are selected, and informing said column decoder which state is stored.

4. The EEPROM according to claim 2, comprising:

a $V_{PP}$ generator for generating a high voltage $V_{PP}$, and a third control register for, in accordance with a third signal externally applied, storing a state indicating whether a load is applied to or data is written into the memory cells of said memory cell array, wherein said controller causes the high voltage $V_{PP}$ generated by said $V_{PP}$ generator to be applied to all the word lines selected by said row decoder when said third control register stores a state for applying a load, and instructs said column latch to latch data externally applied and writes the latched data into the memory cells connected to the bit lines and one or all of the word lines selected by said column decoder and said row decoder, respectively, when said third control register stores the state of writing data.

5. The EEPROM according to claim 4, comprising:

a fourth control register for, in accordance with a fourth signal externally applied, storing a state indicating whether the high voltage $V_{PP}$ or a source voltage $V_{DD}$ is applied, wherein said controller causes one of the high voltage $V_{PP}$ generated by said $V_{PP}$ generator and the source voltage $V_{DD}$ to be applied to all the word lines selected by said row decoder in accordance with the state stored in said fourth control register when said third control register stores the state indication applying a load.

6. An EEPROM having a page write function to enable plural bytes of data to be written simultaneously comprising:

a memory cell array having a plurality of memory cells connected to a plurality of bit lines and a plurality of word lines, a column decoder for bit line selection, a row decoder for word line selection, a column latch for latching data, a $V_{PP}$ generator for generating a high voltage $V_{PP}$, a first control register for, in accordance with a first signal externally applied, storing a state indicating whether a load is applied to or data is written into the memory cells of said memory cell array, and a controller for causing the high voltage $V_{PP}$ generated by said $V_{PP}$ generator to be applied to all of the bit lines when said first control register stores a state indicating applying a load and for instructing said column latch to latch data externally applied and write the latched data into the memory cells connected to the bit lines and the word line selected by said column decoder and said row decoder, respectively, when said first control register stores the state indicating writing of data.

7. The EEPROM according to claim 6, comprising:

a second control register for, in accordance with a second signal externally applied, storing a state indicating whether the high voltage $V_{PP}$ or a source voltage $V_{DD}$ is applied, wherein said controller causes one of the high voltage $V_{PP}$ generated by said $V_{PP}$ generator and the source voltage $V_{DD}$ to be applied to all the bit lines in accordance with the state stored in said second control register when said first control register stores the state of applying a load.

8. The EEPROM according to claim 7 comprising:

a third control register for, in accordance with a third signal externally applied, storing a state indicating whether one of the word lines or all of the word lines are selected and informing said row detector which state is stored, and a fourth control register for, in accordance with a fourth signal externally applied, storing a state indicating whether the word lines or the bit lines are selected, wherein said controller causes one of the high voltage $V_{PP}$ generated by said $V_{PP}$ generator and the source voltage $V_{DD}$ to be applied in accordance with the state stored in said second control register to all of the bit lines or all of the word lines in accordance with the state stored in said fourth control register when said first control register stores the state indicating applying a load.

9. The EEPROM according to claim 8, comprising a fifth control register for, in accordance with a fifth signal externally applied, storing a state indicating whether one byte of the bit lines or all the bit lines are selected, and informing said column decoder which state is stored.

10. An EEPROM having a page write function to enable plural bytes of data to be written simultaneously comprising:

a memory cell array having a plurality of memory cells connected to a plurality of bit lines and a plurality of word lines, a column decoder for bit line selection, a row decoder for word line selection, a column latch for latching data, a $V_{PP}$ generator for generating a high voltage $V_{PP}$, a first control register for, in accordance with a first signal externally applied, storing a state indicating whether the high voltage $V_{PP}$ or a source voltage $V_{DD}$ is applied, a second control register for, in accordance with a second signal externally applied, storing a state indicating whether all the bit lines and all the word lines are selected, and a controller for causing one of the high voltage $V_{PP}$ generated by said $V_{PP}$ generator and the source voltage $V_{DD}$ to be applied to all of the bit lines and all of the word lines in accordance with the state stored in said first control register when said second control register stores the state indicating selection of all of the bit lines and all of the word lines and for instructing said column latch to latch data externally applied and write the latched data into the memory cells connected to the bit lines and the word line selected by said column decoder and said row decoder, respectively, when said second control register does not store the state indicating selection of all of the bit lines and all of the word lines.

11. An IC card comprising:

a CPU for processing data, a ROM for storing processing programs, a RAM for storing data temporarily, an EEPROM having a page write function to enable plural bytes of data to be written simultaneously, and an input/output circuit for transferring data to and from the exterior, said EEPROM comprising:

a memory cell array having a plurality of memory cells connected to a plurality of bit lines and a plurality of word lines, a column decoder for bit line selection, a row decoder for word line selection, a first control register for, in accordance with a first signal externally applied, storing a state indicating whether one byte of the bit lines or all of the bit lines are selected and informing said column decoder which state is stored, a second control register for, in accordance with a second signal externally applied, storing a state indicating whether one of the word lines or all of the word lines are selected and informing said row decoder which state is stored, a column latch for latching data, a third control register for, in accordance with a third signal externally applied, storing a state indicating whether a load is applied to or data is written into the memory cells of said memory cell array, a fourth control register for, in accordance with a fourth signal externally applied, storing a state indicating whether the high voltage $V_{PP}$ or a source voltage $V_{DD}$ is applied, a fifth control register for, in accordance with a fifth signal externally applied, storing a state indicating whether the word lines or the bit lines are selected, and a controller for causing one of the high voltage $V_{PP}$ generated by said $V_{PP}$ generator and the source voltage $V_{DD}$ to be applied in accordance with the state stored in said fourth control register to all of the bit lines or all of the word lines in accordance with the state stored in said fifth control register when said third control register stores the state of applying a load, and for instructing said column latch to latch data externally applied and write the latched data into the memory cells connected to the bit lines and the word line selected respectively by said column decoder and said row decoder when said third control register stores the state of writing data.

* * * * *